US012593577B2

(12) United States Patent
Park et al.

(10) Patent No.: US 12,593,577 B2
(45) Date of Patent: Mar. 31, 2026

(54) DISPLAY DEVICE FOR REDUCING RECOGNITION OF AN AREA ADJACENT A COMPONENT AREA

(71) Applicant: Samsung Display Co., Ltd., Yongin-si (KR)

(72) Inventors: Hyungjun Park, Yongin-si (KR); Junyong An, Yongin-si (KR); Nuree Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 638 days.

(21) Appl. No.: 17/988,661

(22) Filed: Nov. 16, 2022

(65) Prior Publication Data

US 2023/0165083 A1     May 25, 2023

(30) Foreign Application Priority Data

Nov. 23, 2021     (KR) ........................ 10-2021-0162786

(51) Int. Cl.
H10K 59/131         (2023.01)
H10K 59/121         (2023.01)
(Continued)

(52) U.S. Cl.
CPC ....... H10K 59/131 (2023.02); H10K 59/1213 (2023.02); H10K 59/126 (2023.02); H10K 59/65 (2023.02)

(58) Field of Classification Search
CPC ............. H10K 59/131; H10K 59/1213; H10K 59/126; H10K 59/65; H10K 59/121;
(Continued)

(56) References Cited

U.S. PATENT DOCUMENTS

| | | | |
|---|---|---|---|
| 9,525,014 B2 | 12/2016 | Yoo et al. | |
| 10,852,607 B2 | 12/2020 | Yeh et al. | |
| 2022/0093038 A1 | 3/2022 | Yang et al. | |

FOREIGN PATENT DOCUMENTS

| | | | |
|---|---|---|---|
| CN | 206451466 U | 8/2017 | |
| CN | 110620129 A * | 12/2019 | ............. G07F 17/34 |

(Continued)

OTHER PUBLICATIONS

English translation of "CN 113178473 A" Lou et al., "Display Panel and Display Device", Jul. 27, 2021 (Year: 2021).*

(Continued)

*Primary Examiner* — Mounir S Amer
*Assistant Examiner* — Nicholas B Michaud
(74) *Attorney, Agent, or Firm* — Womble Bond Dickinson (US) LLP

(57)          ABSTRACT

A display device includes: a substrate including a second area including a first outer pixel area overlapping a first outer column spaced from a first area and a first inner pixel area overlapping a first inner column at least partially overlapping the first area; a first outer pixel circuit arranged in the first outer pixel area and connected to a first outer data line extending along the first outer column; a first inner pixel circuit arranged in the first inner pixel area and connected to a first inner data line connected to the first outer data line and extending along the first inner column; a first outer display element overlapping the first inner column in the first area and connected to the first outer pixel circuit; and a first inner display element overlapping the first inner pixel area and connected to the first inner pixel circuit.

17 Claims, 21 Drawing Sheets

(51) Int. Cl.
   *H10K 59/126*        (2023.01)
   *H10K 59/65*         (2023.01)

(58) Field of Classification Search
   CPC .... H10H 29/142; H10H 20/857; H10D 86/40;
                     H10D 86/441; H10D 86/60; G09G
                                              2300/0426
   USPC ......................................................... 257/40
   See application file for complete search history.

(56)                     References Cited

FOREIGN PATENT DOCUMENTS

CN            110874990  A       3/2020
CN            111710276  A       9/2020
CN            111785761  A      10/2020
CN            113178473  A  *    7/2021   ............ H10K 59/00

OTHER PUBLICATIONS

English translation of "CN 110620129 A" Li et al., "Display Base
Plate, Its Driving Method, Display Device and High Precision Metal
Mask", Dec. 27, 2019 (Year: 2019).*

* cited by examiner

DISPLAY DEVICE FOR REDUCING RECOGNITION OF AN AREA ADJACENT A COMPONENT AREA

CROSS-REFERENCE TO RELATED APPLICATION

This application claims priority to and the benefit of Korean Patent Application No. 10-2021-0162786, filed on Nov. 23, 2021, in the Korean Intellectual Property Office (KIPO), the entire disclosure of which is incorporated by reference herein.

BACKGROUND

1. Field

One or more embodiments relate to a display device.

2. Description of the Related Art

Recently, the purposes of display devices have diversified. Also, the thicknesses and weights of the display devices are decreasing, and thus the range of use thereof is becoming wider.

Various functions grafted onto or associated with the display devices are being added with the enlargement of the areas occupied by regions displaying images from among the display devices. To add the various functions, the display devices including component areas that perform the various functions while displaying images are continuously studied.

SUMMARY

A component area may maintain high transmittance for light or sound so as to perform a function thereof. Accordingly, a pixel circuit configured to drive a display element may not be arranged in the component area. In this case, the pixel circuit configured to drive the display element may be arranged in an adjacent area adjacent to the component area so as not to overlap the component area.

The adjacent area may be an area where the pixel circuit arranged and, at the same time, an image is displayed. However, when the adjacent area is arranged only at one side of the component area, a user may recognize the adjacent area.

Aspects of one or more embodiments of the present disclosure are directed to a display device having a shape in which an adjacent area surrounds at least a part of an outer circumference of a component area to prevent or substantially prevent a user from recognizing the adjacent area.

Additional aspects will be set forth in part in the description which follows and, in part, will be apparent from the description, or may be learned by practice of the presented embodiments of the present disclosure.

A display device includes: a substrate including a first area, a second area surrounding at least a portion of the first area, and a third area surrounding the second area, the second area including a first outer pixel area overlapping a first outer column spaced from the first area and a first inner pixel area overlapping a first inner column at least partially overlapping the first area; a first outer data line extending along the first outer column; a first inner data line electrically connected to the first outer data line and extending along the first inner column; a first outer pixel circuit arranged in the first outer pixel area and electrically connected to the first outer data line; a first inner pixel circuit arranged in the first inner pixel area and electrically connected to the first inner data line; a first display element arranged in the first area and including a first outer display element overlapping the first inner column and electrically connected to the first outer pixel circuit; and a second display element arranged in the second area and including a first inner display element overlapping the first inner pixel area and electrically connected to the first inner pixel circuit.

The display device further includes a plurality of connecting wires extending from the second area to the first area and including a transparent conducting oxide. A number of the plurality of connecting wires arranged on a first row crossing the first outer column may be different from a number of the plurality of connecting wires arranged on a second row different from the first row.

The display device may further include an intermediate pixel circuit arranged in the first outer pixel area. The second display element may further include an intermediate display element arranged in the first outer pixel area and electrically connected to the intermediate pixel circuit.

The display device may further include an intermediate data line extending along the first outer column and electrically connected to the intermediate pixel circuit, a first data line extending along the first outer column in parallel with the intermediate data line, and a first pixel circuit arranged adjacent to the first outer pixel area in the third area, and electrically connected to the first data line.

The display device may further include a second data line extending along the first inner column in parallel with the first inner data line, and a second pixel circuit arranged adjacent to the first inner pixel area in the third area, and electrically connected to the second data line.

The second area may further include a second outer pixel area overlapping a second outer column different from the first outer column and spaced from the first area. The display device may further include a second outer data line extending along the second outer column, a second inner data line electrically connected to the second outer data line and extending along the first inner column, a second outer pixel circuit arranged in the second outer pixel area and electrically connected to the second outer data line, and a second inner pixel circuit arranged in the first inner pixel area and electrically connected to the second inner data line. The first display element may further include a second outer display element overlapping a second inner column different from the first inner column. Any one of the first display element and the second display element may include a second inner display element at least partially overlapping the first area and overlapping the second inner column different from the first inner column. The second outer display element may be electrically connected to the second outer pixel circuit. The second inner display element may be electrically connected to the second inner pixel circuit.

The display device may further include a first connecting wire extending from the second outer column to the second inner column, and electrically connecting the second outer pixel circuit and the second outer display element to each other, and a second connecting wire extending from the first inner column to the second inner column, and electrically connecting the second inner pixel circuit and the second inner display element to each other, wherein the first inner column may be arranged between the second outer column and the second inner column.

The display device may further include an additional data line electrically connected to the second inner data line and extending along the second inner column.

The display device may further include a third display element arranged in the third area and including an emission area smaller than any one of an emission area of the first display element and an emission area of the second display element. A width of the second area at the first outer column may be smaller than (e.g., less than) a sum of a width of the first area and a width of the second area at the first inner column.

The first area and the second area may further include a plurality of pixel areas arranged in a first direction and a second direction perpendicular to the first direction. The plurality of pixel areas may include a plurality of first pixel areas overlapping a first virtual extending line extending in the first direction, and a plurality of second pixel areas overlapping a second virtual extending line extending in the first direction and adjacent to the first virtual extending line, wherein a difference between a number of the plurality of first pixel areas and a number of the plurality of second pixel areas may be a multiple of four.

According to one or more embodiments, a display device includes a substrate including a first area, a second area at least partially surrounding the first area, and a third area at least partially surrounding the second area, a first display element arranged in the first area, a second display element arranged in the second area, and a third display element arranged in the third area and including an emission area smaller than any one of an emission area of the first display element and an emission area of the second display element. A width of the second area at a first outer column spaced from the first area is smaller than (e.g., less than) a sum of a width of the first area and a width of the second area at a first inner column at least partially overlapping the first area.

The first area and the second area may include a plurality of pixel areas arranged in a first direction and a second direction perpendicular to the first direction. The plurality of pixel areas may include a plurality of first pixel areas overlapping a first virtual extending line extending in the first direction, and a plurality of second pixel areas overlapping a second virtual extending line extending in the first direction and adjacent to the first virtual extending line. A difference between a number of the plurality of first pixel areas and a number of the plurality of second pixel areas may be a multiple of four.

The display device may further include a plurality of connecting wires extending from the second area to the first area and including a transparent conducting oxide. A number of the plurality of connecting wires arranged on a first row crossing the first outer column may be different from a number of the plurality of connecting wires arranged on a second row different from the first row.

The second area may include a first outer pixel area overlapping the first outer column and a first inner pixel area overlapping the first inner column. The display device may further include a first outer data line extending along the first outer column, a first inner data line electrically connected to the first outer data line and extending along the first inner column, a first outer pixel circuit arranged in the first outer pixel area and electrically connected to the first outer data line, and a first inner pixel circuit arranged in the first inner pixel area and electrically connected to the first inner data line. The first display element may include a first outer display element overlapping the first inner column and electrically connected to the first outer pixel circuit. The second display element may include a first inner display element arranged in the first inner pixel area and electrically connected to the first inner pixel circuit.

The second area may further include a second outer pixel area overlapping a second outer column different from the first outer column and spaced from the first area. The display device may further include a second outer data line extending along the second outer column, a second inner data line electrically connected to the second outer data line and extending along the first inner column, a second outer pixel circuit arranged in the second outer pixel area and electrically connected to the second outer data line, and a second inner pixel circuit arranged in the first inner pixel area and electrically connected to the second inner data line. The first display element may further include a second outer display element overlapping a second inner column different from the first inner column. Any one of the first display element and the second display element may include a second inner display element at least partially overlapping the first area and overlapping the second inner column different from the first inner column. The second outer display element may be electrically connected to the second outer pixel circuit. The second inner display element may be electrically connected to the second inner pixel circuit.

The display device may further include a first connecting wire extending from the second outer column to the second inner column, and electrically connecting the second outer pixel circuit and the second outer display element to each other, and a second connecting wire extending from the first inner column to the second inner column, and electrically connecting the second inner pixel circuit and the second inner display element to each other. The first inner column may be arranged between the second outer column and the second inner column.

The display device may further include an additional data line electrically connected to the second inner data line and extending along the second inner column.

The display device may further include an intermediate pixel circuit overlapping the first outer pixel area. The second display element may further include an intermediate display element arranged in the first outer pixel area and electrically connected to the intermediate pixel circuit.

The display device may further include an intermediate data line extending along the first outer column and electrically connected to the intermediate pixel circuit, a first data line extending along the first outer column in parallel with the intermediate data line, and a first pixel circuit arranged adjacent to the first outer pixel area in the third area, and electrically connected to the first data line.

The display device may further include a second data line extending along the first inner column in parallel with the first inner data line, and a second pixel circuit arranged adjacent to the first inner pixel area in the third area, and electrically connected to the second data line.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 2 is a cross-sectional view of the display device taken along the line A-A' of FIG. 1;

FIGS. 10A and 10B are cross-sectional views of a display panel taken along the line E-E' of FIG. 9;

DETAILED DESCRIPTION

Figure 1:
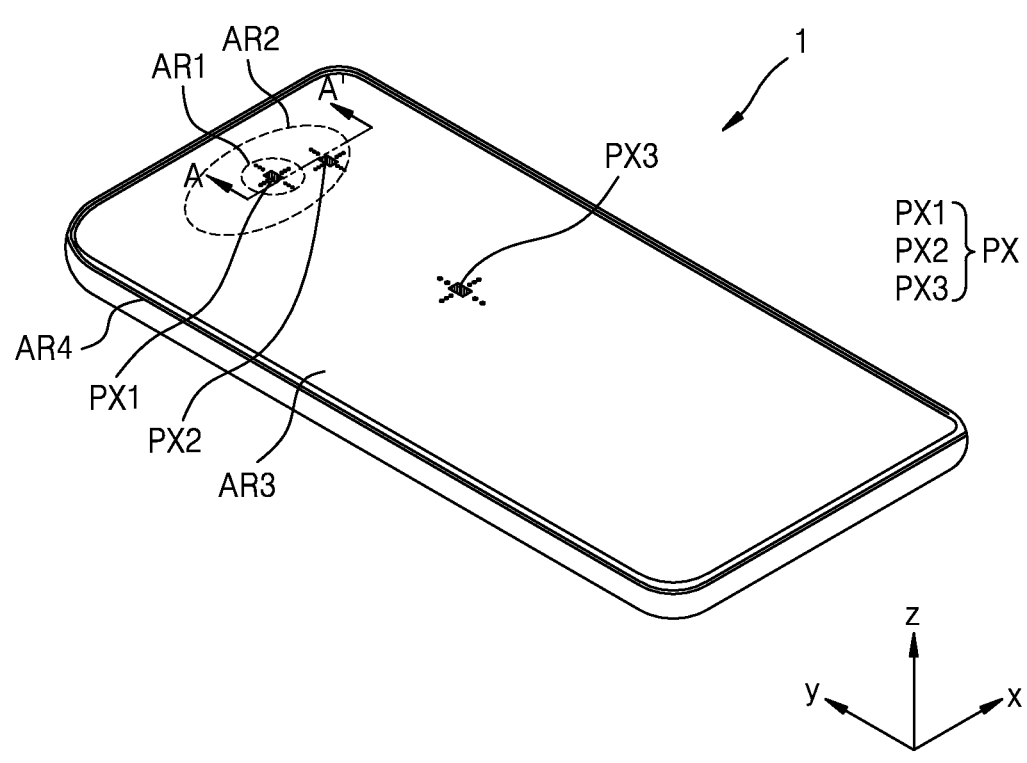
FIG. 1 is a perspective view schematically showing a display device according to an embodiment.

Reference will now be made in more detail to embodiments, examples of which are illustrated in the accompanying drawings, wherein like reference numerals refer to like elements throughout, and duplicative descriptions thereof may not be repeated. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

The disclosure may have various modifications and various embodiments, and specific embodiments are illustrated in the drawings and are described in more detail in the detailed description. Effects and features of the present disclosure and methods of achieving the same will become apparent with reference to embodiments described in more detail with reference to the drawings. However, the present disclosure is not limited to the embodiments described below, and may be implemented in various forms.

One or more embodiments will be described below in more detail with reference to the accompanying drawings. Those components that are the same or are in correspondence with each other are rendered the same reference numeral regardless of the figure number, and redundant explanations may not be repeated.

The terms, such as "first," "second," and the like are not used in limited meanings, but are used to distinguish one component from another component.

In the following embodiments, an expression used in the singular encompasses the expression of the plural, unless it has a clearly different meaning in the context.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

It will be understood that when a layer, region, or element is referred to as being "formed on" another layer, area, or element, it can be directly or indirectly formed on the other layer, region, or element. That is, for example, one or more intervening layers, regions, or elements may be present.

Further, the use of "may" when describing embodiments of the present disclosure refers to "one or more embodiments of the present disclosure."

In the drawings, for convenience of description, sizes of components may be exaggerated or reduced. In other words, because sizes and thicknesses of components in the drawings are arbitrarily illustrated for convenience of explanation, the present disclosure is not necessarily limited thereto.

When a certain embodiment may be implemented differently, a specific process order may be performed differently from the described order. For example, two consecutively described processes may be performed substantially at the same time or performed in an order opposite to the described order.

When a layer, region, component, or the like is connected to another layer, region, component, or the like, the layer, the region, the component, or the like may be not only directly connected thereto, but also indirectly connected thereto with an intervening layer, region, component, or the like therebetween. For example, in the specification, when a layer, region, component, or the like is electrically connected to another layer, region, component, or the like, the layer, region, component, or the like may be nor only directly electrically connected thereto, but also indirectly electrically connected thereto with one or more intervening layers, regions, components, or the like therebetween.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically showing a display device 1 according to an embodiment.

Referring to FIG. 1, the display device 1 may display an image. The display device 1 may include a pixel PX. The pixel PX may be defined as an area in which a display element emits light. A plurality of the pixels PX may be arranged in the display device 1. Each of the plurality of pixels PX may emit light, and the plurality of pixels PX may display an image. According to an embodiment, the pixels PX may include a first pixel PX1, a second pixel PX2, and a third pixel PX3.

The display device 1 may include a first area AR1, a second area AR2, a third area AR3, and a fourth area AR4. The pixels PX may be arranged in the first area AR1, the second area AR2, and the third area AR3. Accordingly, the first area AR1, the second area AR2, and the third area AR3 may be a display area. The pixel PX may not be arranged in the fourth area AR4, and the fourth area AR4 may be a non-display area.

The first area AR1 may be an area overlapping a component and an area where the pixels PX are arranged. For example, the first pixel PX1 may be arranged in the first area AR1. According to an embodiment, a plurality of the first pixels PX1 may be arranged in the first area AR1. Accordingly, the display device 1 may overlap the component in the first area AR1 and display an image.

Because the first area AR1 may be an area overlapping the component, the display device 1 may have high transmittance of light or sound in the first area AR1. For example, light transmittance of the display device 1 in the first area AR1 may be about 10% or more, preferably, 25% or more, 40% or more, 50% or more, 85% or more, or 90% or more. According to an embodiment, the transmittance of light or sound of the display device 1 in the first area AR1 may be equal to or greater than the transmittance of light or sound of the display device 1 in the second area AR2 and the third area AR3.

The display device 1 may include at least one first area AR1. For example, the display device 1 may include one first area AR1 or a plurality of the first areas AR1.

In FIG. 1, the first area AR1 has a circular shape, but according to another embodiment, the first area AR1 may have any shape, such as an oval shape, a polygonal shape, a star shape, or a diamond shape. Hereinafter, a case in which the first area AR1 has a circular shape will be mainly described in more detail.

The second area AR2 may be around (e.g., at least partially surround) the first area AR1. For example, the second area AR2 may entirely surround the first area AR1. As another example, the second area AR2 may surround only a portion of the first area AR1. According to an embodiment, the second area AR2 may extend along an outer circumference of the first area AR1. According to an embodiment, the outer circumference of the second area AR2 may substantially have an oval shape. According to another embodiment, a distance between end portions (e.g., outer end portions) of the second area AR2, which are spaced from each other in a first direction (e.g., an x or −x direction) may be different from a distance between end portions (e.g., outer end portions) of the second area AR2, which are spaced from each other in a second direction (e.g., a y or −y direction). For example, the distance between the end portions of the second area AR2, which are spaced from each other in the first direction (e.g., the x or −x direction), may be greater than the distance between the end portions (e.g., the outer end portions) of the second area AR2, which are spaced from each other in the second direction (e.g., the y or −y direction).

The second pixel PX2 may be arranged in the second area AR2. According to an embodiment, a plurality of the second pixels PX2 may be arranged in the second area AR2. Accordingly, the display device 1 may display an image in the second area AR2.

In FIG. 1, the first area AR1 and the second area AR2 are arranged at an upper side the display device 1, but according to another embodiment, the first area AR1 and the second area AR2 may be arranged at a lower side, a right side, or a left side of the display device 1.

The third area AR3 may be around (e.g., at least partially surround) the second area AR2. According to an embodiment, the third area AR3 may be around (e.g., at least partially surround) the first area AR1 and the second area AR2. For example, the third area AR3 may surround only portions of the first area AR1 and second area AR2. As another example, the third area AR3 may entirely surround the first area AR1 and the second area AR2. According to an embodiment, a resolution of the display device 1 in the third area AR3 may be equal to or higher than a resolution of the display device 1 in the first area AR1. The resolution of the display device 1 in the third area AR3 may be equal to or higher than a resolution of the display device 1 in the second area AR2.

The fourth area AR4 may be around (e.g., at least partially surround) the first area AR1. According to an embodiment, the fourth area AR4 may entirely surround the first area AR1. According to an embodiment, the fourth area AR4 may entirely surround the first area AR1, the second area AR2, and the third area AR3.

Figure 2:
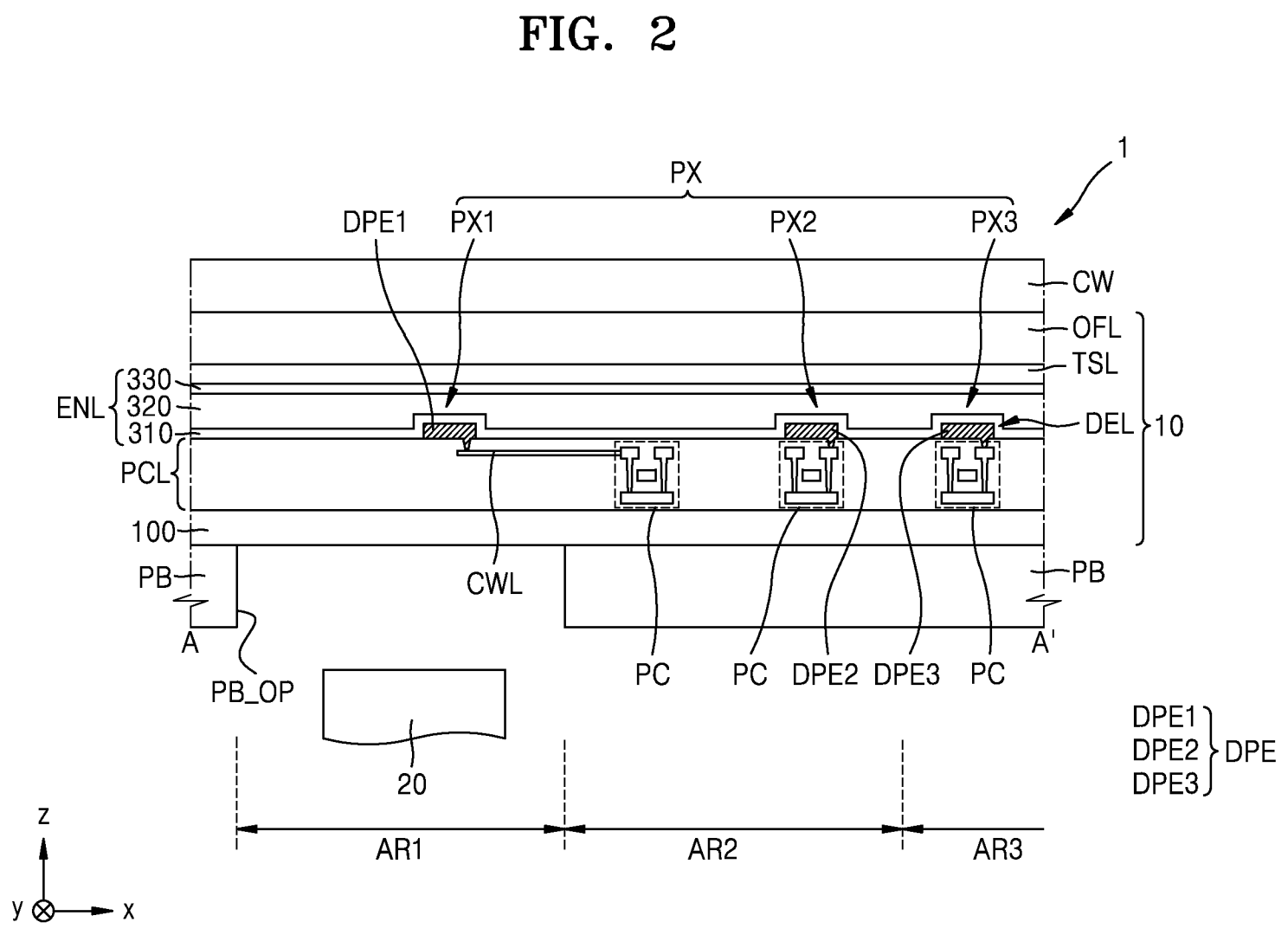

FIG. 2 is a cross-sectional view of the display device 1 taken along the line A-A' of FIG. 1.

Referring to FIG. 2, the display device 1 may include a display panel 10, a panel protection member PB, a component 20, and a cover window CW. The display panel 10 may include a substrate 100, a pixel circuit layer PCL including a pixel circuit PC, a display element layer DEL including a display element DPE, an encapsulation layer ENL, a touch sensor layer TSL, and an optical function layer OFL.

The display device 1 may include the first area AR1, the second area AR2, and the third area AR3. In other words, the first area AR1, the second area AR2, and the third area AR3 may be defined in the substrate 100 and a multilayer structure on the substrate 100. For example, the first area AR1, the second area AR2, and the third area AR3 may be defined in the substrate 100. In other words, the substrate 100 may include the first area AR1, the second area AR2, and the third area AR3. Hereinafter, a case in which the substrate 100 includes the first area AR1, the second area AR2, and the third area AR3 is mainly described in more detail.

The substrate 100 may include an insulating material, such as glass, quartz, a polymer resin, and/or the like. The substrate 100 may be a rigid substrate or a flexible substrate capable of being bent, folded, or rolled.

The pixel circuit layer PCL may be disposed on the substrate 100. The pixel circuit layer PCL may include the pixel circuit PC, a connecting wire CWL, and an insulating layer. The pixel circuit PC may include at least one thin-film transistor. There may be a plurality of the pixel circuits PC. The plurality of pixel circuits PC may be arranged in at least one of the second area AR2 or the third area AR3. The pixel circuit PC may not be arranged in the first area AR1. Accordingly, transmittance (e.g., light transmittance) of the display panel 10 in the first area AR1 may be higher than transmittance (e.g., light transmittance) of the display panel 10 in the second area AR2 and third area AR3.

The connecting wire CWL may be connected (e.g., electrically connected) to the pixel circuit PC. According to an embodiment, the connecting wire CWL may be connected (e.g., electrically connected) to the pixel circuit PC arranged in the second area AR2. According to an embodiment, the connecting wire CWL may include a transparent conducting oxide. For example, the connecting wire CWL may include a conducting oxide, such as indium tin oxide (ITO), indium zinc oxide (IZO), ZnO, indium oxide ($In_2O_3$), indium gallium oxide (IGO), and/or aluminum zinc oxide (AZO).

The display element layer DEL may include the display element DPE and be disposed on the pixel circuit layer PCL. According to an embodiment, the display element DPE may realize the pixel PX by emitting light. According to an embodiment, the display element DPE may be an organic light-emitting diode including an organic emission layer. In one or more embodiments, the display element DPE may be a light-emitting diode (LED). A size of the LED may be in micro-scale or nano-scale. For example, the LED may be a micro LED. In one or more embodiments, the LED may be a nanorod LED. The nanorod LED may include gallium nitride (GaN). According to an embodiment, a color conversion layer may be disposed on the nanorod LED. The color conversion layer may include a quantum dot. In one or more embodiments, the display element DPE may be a quantum dot LED including a quantum dot emission layer. In one or more embodiments, the display element DPE may be an inorganic LED including an inorganic semiconductor. Hereinafter, a case in which the display element DPE is an organic light-emitting diode will be mainly described in more detail.

There may be a plurality of the display elements DPE. The plurality of display elements DPE may be arranged in the first area AR1, the second area AR2, and the third area AR3. The plurality of display elements DPE may include a first display element DPE1 arranged in the first area AR1, a second display element DPE2 arranged in the second area AR2, and a third display element DPE3 arranged in the third area AR3. The first display element DPE1 may realize the first pixel PX1 by emitting light. The second display element DPE2 may realize the second pixel PX2 by emitting light. The third display element DPE3 may realize the third pixel PX3 by emitting light. Accordingly, the display device 1 may display an image in the first area AR1, the second area AR2, and the third area AR3.

The display element DPE may be connected (e.g., electrically connected) to the pixel circuit PC. The first display element DPE1 may be connected (e.g., electrically connected) to the pixel circuit PC arranged in the second area AR2. According to an embodiment, the first display element DPE1 may be connected (e.g., electrically connected) to the pixel circuit PC arranged in the second area AR2, through the connecting wire CWL. The second display element DPE2 may be connected (e.g., electrically connected) to the pixel circuit PC arranged in the second area AR2. The third display element DPE3 may be connected (e.g., electrically connected) to the pixel circuit PC arranged in the third area AR3.

The encapsulation layer ENL may be disposed on the display element layer DEL. The encapsulation layer ENL may cover the display element DPE. According to an embodiment, the encapsulation layer ENL may include at least one inorganic encapsulation layer and at least one organic encapsulation layer. The at least one inorganic encapsulation layer may include at least one inorganic material from among aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). ZnO may be ZnO and/or $ZnO_2$. The at least one organic encapsulation layer may include a polymer-based material. Examples of the polymer-based material may include an acrylic resin, an epoxy resin, polyimide, and polyethylene. According to an embodiment, the at least one organic encapsulation layer may include acrylate.

According to an embodiment, the encapsulation layer ENL may include a first inorganic encapsulation layer 310, an organic encapsulation layer 320, and a second inorganic encapsulation layer 330, which are sequentially stacked in the stated order. For example, the second inorganic encapsulation layer 330 may be stacked on the first inorganic encapsulation layer 310 with the organic encapsulation layer 320 therebetween. The first inorganic encapsulation layer 310 and the second inorganic encapsulation layer 330 may prevent or reduce exposure of the organic encapsulation layer 320 and/or the display element DPE to a foreign substance, such as moisture.

According to another embodiment, the encapsulation layer ENL may have a structure in which the substrate 100 and an upper substrate of a transparent member are combined via a sealing member, thereby sealing an internal space between the substrate 100 and the upper substrate. Here, a moisture absorbent or filler may be located in the internal space. The sealing member may be a sealant, and according to another embodiment, the sealing member may include a material hardened by a laser beam. For example, the sealing member may be a frit. In detail, the sealing member may include a urethane-based resin, an epoxy-based resin, or an acryl-based resin, which is an organic sealant, or an inorganic sealant. According to an embodiment, the sealing member may include silicone. The urethane-based resin may use, for example, urethane acrylate. The acryl-based resin may use, for example, butyl acrylate or ethylhexyl acrylate. In one or more embodiments, the sealing member may include a material hardened by heat.

The touch sensor layer TSL may obtain coordinate information according to an external input, for example, a touch event. The touch sensor layer TSL may include a touch electrode and touch wires connected to the touch electrode.

The touch sensor layer TSL may detect the external input via a magnetic capacitance method or a mutual capacitance method.

The touch sensor layer TSL may be disposed on the encapsulation layer ENL. According to an embodiment, the touch sensor layer TSL may be disposed directly on the encapsulation layer ENL. In this case, an adhesive layer, such as an optical clear adhesive, may not be arranged between the touch sensor layer TSL and the encapsulation layer ENL. According to another embodiment, the touch sensor layer TSL may be formed separately on a touch substrate and then combined on the encapsulation layer ENL via an adhesive layer, such as an optical clear adhesive.

The optical function layer OFL may include a reflection preventing layer. The reflection preventing layer may reduce reflectance of light (e.g., external light) incident from the outside towards the display device 1. According to one or more embodiments, the optical function layer OFL may be a polarizing film. According to one or more embodiments, the optical function layer OFL may be implemented as a filter plate including a black matrix and color filters.

The cover window CW may be disposed on the display panel 10. The cover window CW may protect the display panel 10. The cover window CW may include at least one of glass, sapphire, or plastic. The cover window CW may be, for example, ultra-thin glass or colorless polyimide.

The panel protection member PB may be disposed below the substrate 100. The panel protection member PB may support and protect the substrate 100. According to an embodiment, the panel protection member PB may include an opening PB_OP overlapping the first area AR1. According to another embodiment, the opening PB_OP of the panel protection member PB may overlap the first area AR1 and the second area AR2. According to an embodiment, the panel protection member PB may include polyethylene terephthalate or polyimide.

The component 20 may be disposed below the display panel 10. According to an embodiment, the display panel 10 may be arranged between the cover window CW and the component 20. According to an embodiment, the component 20 may overlap the first area AR1. Thus, according to an embodiment, the first area AR1 may be a component area. The second area AR2 may be an adjacent area adjacent to the component area.

The component 20 is a camera using infrared light or visible light, and may include an imaging device. In one or more embodiments, the component 20 may be a solar cell, a flash, an illuminance sensor, a proximity sensor, or an iris sensor. In one or more embodiments, the component 20 may have a function of receiving sound. To prevent a function of the component 20 from being limited, the pixel circuit PC driving the first display element DPE1 may be arranged in the second area AR2 instead of the first area AR1. Accordingly, transmittance of the display panel 10 in the first area AR1 may be higher than transmittance of the display panel 10 in the second area AR2. Also, the transmittance of the display panel 10 in the first area AR1 may be higher than the transmittance of the display panel 10 in the third area AR3.

Figure 3:
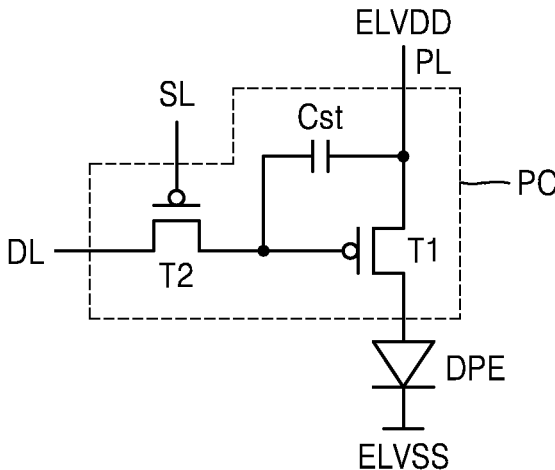
FIG. 3 is an equivalent circuit diagram schematically showing a pixel circuit electrically connected to a display element, according to an embodiment.

FIG. 3 is an equivalent circuit diagram schematically showing the pixel circuit PC connected (e.g., electrically connected) to the display element DPE, according to an embodiment.

Referring to FIG. 3, the pixel circuit PC may include a driving thin-film transistor T1, a switching thin-film transistor T2, and a storage capacitor Cst.

The switching thin-film transistor T2 is connected (e.g., electrically connected) to each of a scan line SL and a data line DL, and may transmit, to the driving thin-film transistor T1, a data signal or data voltage input from the data line DL, based on a scan signal or switching voltage input from the scan line SL. The storage capacitor Cst is connected (e.g., electrically connected) to the switching thin-film transistor T2 and a driving voltage line PL, and may store a voltage corresponding to a difference between a voltage received from the switching thin-film transistor T2 and a driving voltage ELVDD supplied to the driving voltage line PL.

The driving thin-film transistor T1 is connected (e.g., electrically connected) to each of the driving voltage line PL and the storage capacitor Cst, and may be configured to control a driving current flowing through the display element DPE from the driving voltage line PL in response to a voltage value stored in the storage capacitor Cst. The display element DPE may emit a light of a certain luminance according to the driving current. An opposing electrode of the display element DPE may receive a common voltage ELVSS.

In FIG. 3, the pixel circuit PC includes two thin-film transistors and one storage capacitor. However, the present disclosure is not limited thereto. For example, the pixel circuit PC may include 3 or more thin-film transistors.

Figure 4:
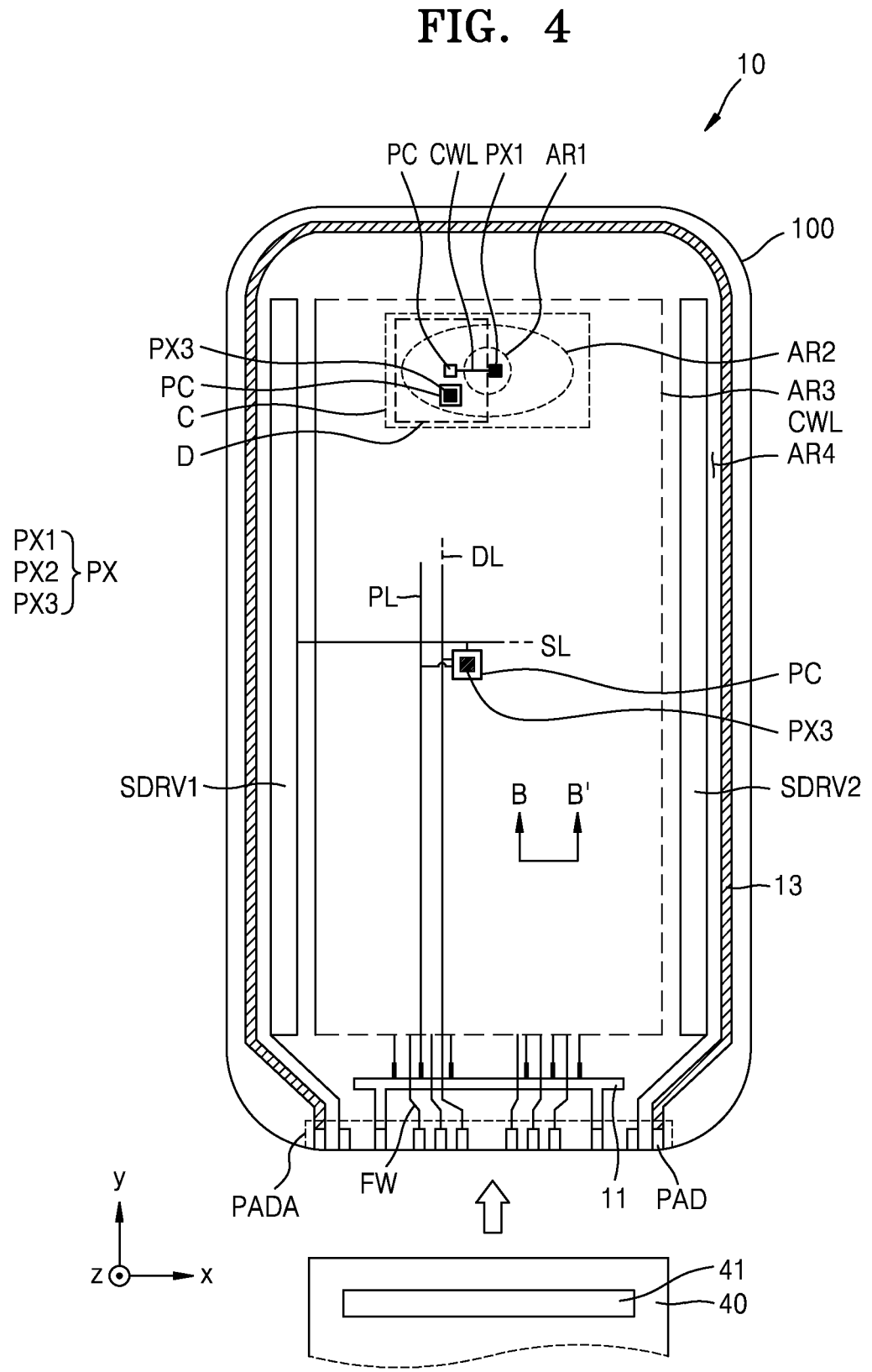
FIG. 4 is a plan view schematically showing a display panel according to an embodiment.

FIG. 4 is a plan view schematically showing the display panel 10 according to an embodiment. In FIG. 4, like reference numerals as FIG. 1 denote like elements, and thus redundant descriptions thereof may not be repeated.

Referring to FIG. 4, the display panel 10 may include the substrate 100, the pixel circuit PC, and the pixel PX. According to an embodiment, the substrate 100 may include the first area AR1, the second area AR2, the third area AR3, and the fourth area AR4. The second area AR2 may be around (e.g., at least partially surround) the first area AR1. According to an embodiment, the outer circumference of the second area AR2 may substantially have an oval shape. According to another embodiment, the distance between end portions (e.g., outer end portions) of the second area AR2, which are spaced from each other in the first direction (e.g., the x or −x direction), may be different from the distance between end portions (e.g., outer end portions) of the second area AR2, which are spaced from each other in the second direction (e.g., the y or −y direction). For example, the distance between the end portions (e.g., the outer end portions) of the second area AR2, which are spaced from each other in the first direction (e.g., the x or −x direction), may be greater than the distance between the end portions (e.g., the outer end portions) of the second area AR2, which are spaced from each other in the second direction (e.g., the y or −y direction). The third area AR3 may be around (e.g., at least partially surround) the second area AR2. The third area AR3 may be around (e.g., at least partially surround) the first area AR1 and the second area AR2. The fourth area AR4 may be around (e.g., at least partially surround) the third area AR3. The fourth area AR4 may be around (e.g., at least partially surround) the first area AR1, the second area AR2, and the third area AR3.

The pixel circuit PC may not be arranged in the first area AR1. The pixel circuit PC may be arranged in the second area AR2 and/or the third area AR3. According to one or more embodiments, the pixel circuit PC may be arranged in the fourth area AR4. There may be the plurality of pixel circuits PC. The plurality of pixel circuits PC may be arranged in the second area AR2 and the third area AR3. Accordingly, sound or light transmittance of the display panel 10 in the first area AR1 may be higher than sound or light transmittance of the display panel 10 in the second area AR2. The sound or light transmittance of the display panel 10 in the first area AR1 may be higher than sound or light transmittance of the display panel 10 in the third area AR3.

The pixel PX may be embodied as a display element such as an organic light-emitting diode. The pixels PX may include the first pixel PX1, the second pixel PX2, and the third pixel PX3. The first pixel PX1 may be connected (e.g., electrically connected) to the pixel circuit PC arranged in the second area AR2. According to an embodiment, the first pixel PX1 may be connected (e.g., electrically connected) to the pixel circuit PC arranged in the second area AR2, through the connecting wire CWL. The second pixel PX2 may be connected (e.g., electrically connected) to the pixel circuit PC arranged in the second area AR2. The second pixel PX2 may be arranged adjacent to the pixel circuit PC arranged in the second area AR2 or may overlap the pixel circuit PC arranged in the second area AR2. The third area AR3 may be connected (e.g., electrically connected) to the pixel circuit PC arranged in the third area AR3. According to an embodiment, the third area AR3 may be arranged adjacent to the pixel circuit PC arranged in the third area AR3 or may overlap the pixel circuit PC arranged in the third area AR3.

There may be the plurality of pixels PX, and the plurality of pixels PX may display an image by emitting light. According to an embodiment, there may be pluralities of the first pixels PX1, the second pixels PX2, and third pixels PX3. The plurality of first pixels PX1, the plurality of second pixels PX2, and the plurality of third pixels PX3 may display one image or different images that are independent from each other.

According to an embodiment, the resolution of the display panel 10 in the first area AR1 and second area AR2 may be equal to or lower than the resolution of the display panel 10 in the third area AR3. For example, the resolution of the display panel 10 in the first area AR1 and second area AR2 may be about 1/1, about 1/2, about 3/8, about 1/3, about 1/4, about 2/9, about 1/8, about 1/9, or about 1/16 of the resolution of the display panel 10 in the third area AR3.

The fourth area AR4 may be a non-display area where the pixel PX is not arranged. According to an embodiment, the display panel 10 may further include a first scan driving circuit SDRV1, a second scan driving circuit SDRV2, a pad PAD, a driving voltage supply line 11, and a common voltage supply line 13, which are arranged in the fourth area AR4.

One of the first scan driving circuit SDRV1 and the second scan driving circuit SDRV2 may apply a scan signal to the pixel circuit PC through the scan line SL. According to an embodiment, the third area AR3 may be arranged between the first scan driving circuit SDRV1 and the second scan driving circuit SDRV2. According to an embodiment, one of the plurality of pixels PX may receive the scan signal from the first scan driving circuit SDRV1, and another one of the plurality of pixels PX may receive the scan signal from the second scan driving circuit SDRV2.

The pad PAD may be arranged in a pad area PADA, as one side of the fourth area AR4. The pad PAD may not be covered by an insulating layer, but may be exposed to be connected (e.g., electrically connected) to a display circuit board 40. A display driving unit 41 may be arranged in the display circuit board 40.

The display driving unit 41 may be configured to generate a signal transmitted to the first scan driving circuit SDRV1 and the second scan driving circuit SDRV2. The display driving unit 41 is configured to generate a data signal, and the generated data signal may be transmitted to the pixel circuit PC through a fanout wire FW and the data line DL connected to the fanout wire FW.

The display driving unit 41 may supply the driving voltage ELVDD (e.g., see FIG. 3) to the driving voltage supply line 11, and supply the common voltage ELVSS (e.g., see FIG. 3) to the common voltage supply line 13. The driving voltage ELVDD may be supplied to pixel circuit PC through the driving voltage line PL connected (e.g., electrically connected) to the driving voltage supply line 11, and the common voltage ELVSS may be supplied to the opposing electrode of the display element connected (e.g., electrically connected) to the common voltage supply line 13.

Figure 5:
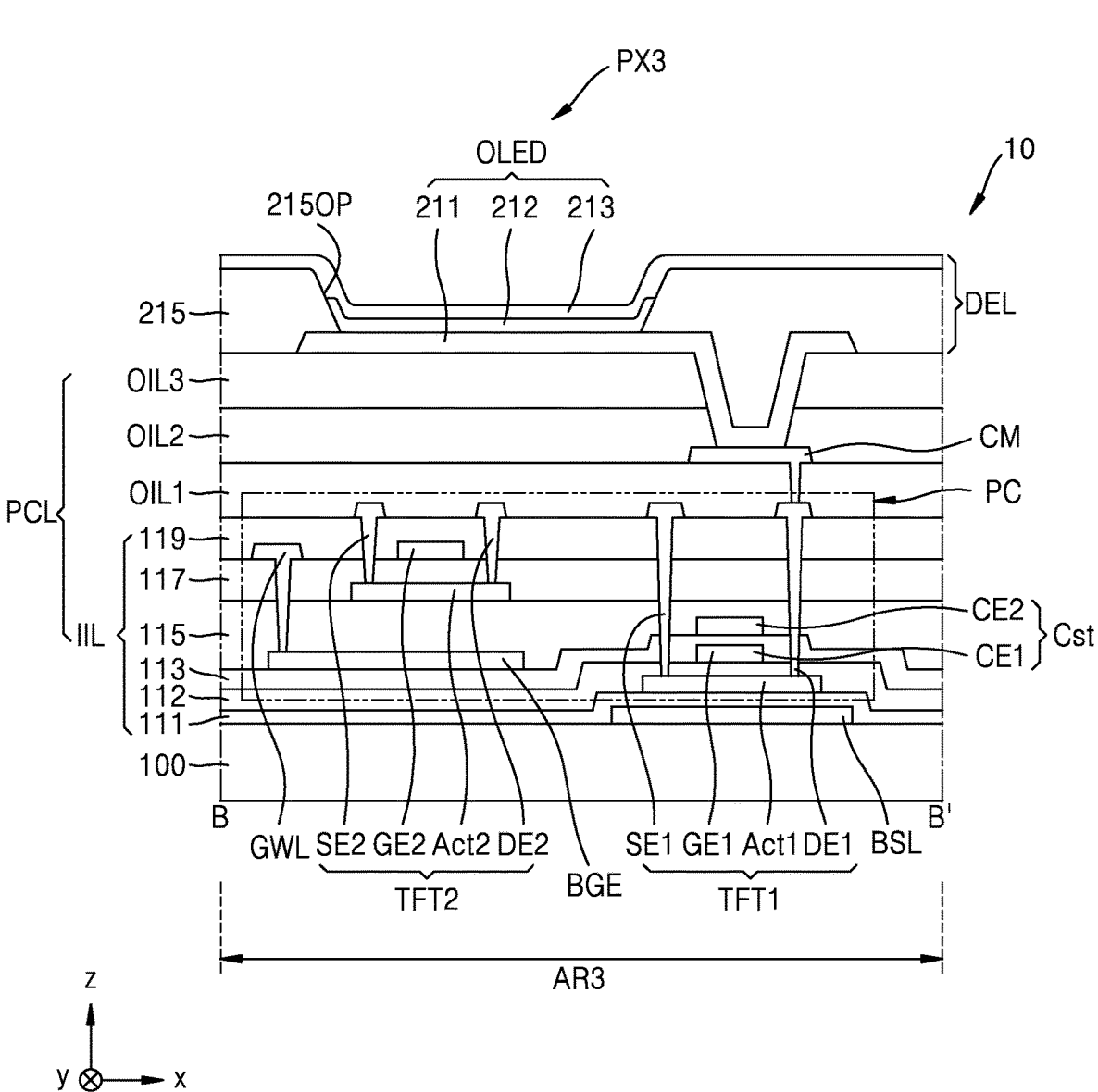
FIG. 5 is a cross-sectional view of the display panel taken along the line B-B' of FIG. 4.

FIG. 5 is a cross-sectional view of the display panel 10 taken along the line B-B' of FIG. 4.

Referring to FIG. 5, the display panel 10 may include the substrate 100, the pixel circuit layer PCL, and the display element layer DEL. According to an embodiment, the substrate 100 may include the third area AR3. The substrate 100 may include glass or a polymer resin, such as polyether sulfone, polyarylate, polyetherimide, polyethylene naphthalate, polyethylene terephthalate, polyphenylene sulfide, polyimide, polycarbonate, cellulose triacetate, or cellulose acetate propionate. According to an embodiment, the substrate 100 may have a multilayer structure including a base layer including the polymer resin described above and a barrier layer. The substrate 100 including the polymer resin may have a flexible, rollable, or bendable characteristic.

The pixel circuit layer PCL may be disposed on the substrate 100. The pixel circuit layer PCL may include the pixel circuit PC, an inorganic insulating layer IIL, a first organic insulating layer OIL1, a connecting electrode CM, a second organic insulating layer OIL2, and a third organic insulating layer OIL3. According to an embodiment, the inorganic insulating layer IL may include a buffer layer 111, a first gate insulating layer 112, a second gate insulating layer 113, a first inorganic insulating layer 115, a second inorganic insulating layer 117, and an interlayer insulating layer 119.

The pixel circuit PC may be arranged in the third area AR3. The pixel circuit PC may include a first thin-film transistor TFT1, a second thin-film transistor TFT2, and the storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a lower electrode CE1 and an upper electrode CE2.

The buffer layer 111 may be disposed on the substrate 100. The buffer layer 111 may include an inorganic insulating material, such as $SiN_x$, SiON, or $SiO_2$, and may be a single layer or multilayer structure including the inorganic insulating material.

The first semiconductor layer Act1 may include a silicon semiconductor. The first semiconductor layer Act1 may include polysilicon. In one or more embodiments, the first semiconductor layer Act1 may include amorphous silicon. According to one or more embodiments, the first semiconductor layer Act1 may include an oxide semiconductor or an organic semiconductor. The first semiconductor layer Act1 may include a channel region, a drain region, and a source region. The drain region and the source region may be arranged at opposite sides of the channel region. The first gate electrode GE1 may overlap the channel region.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), or titanium (Ti), and may include a multilayer or single layer structure including the conductive material.

The first gate insulating layer 112 may be arranged between the first semiconductor layer Act1 and the first gate electrode GE1. Accordingly, the first semiconductor layer Act1 may be insulated from the first gate electrode GE1. The first gate insulating layer 112 may include an inorganic insulating material, such as $SiO_2$, $SiN_x$, SiON, $Al_2O_3$, $TiO_2$, $Ta_2O_5$, hafnium oxide ($HfO_2$), and/or $ZnO_x$. According to an embodiment, ZnO may be ZnO and/or $ZnO_2$.

The second gate insulating layer 113 may cover the first gate electrode GE1. The second gate insulating layer 113 may be disposed on the first gate electrode GE1. Like the first gate insulating layer 112, the second gate insulating layer 113 may include an inorganic insulating material, such as $SiO_2$, $SiN_x$, SiON, $Al_2O_3$, $TiO_2$, $Ta_2O_5$, $HfO_2$, and/or $ZnO_x$.

The upper electrode CE2 may be disposed on the second gate insulating layer 113. The upper electrode CE2 may overlap the first gate electrode GE1 therebelow. In this case, the upper electrode CE2 and the first gate electrode GE1 may overlap each other with the second gate insulating layer 113 therebetween, thereby providing the storage capacitor Cst. In other words, the first gate electrode GE1 of the first thin-film transistor TFT1 may function as the lower electrode CE1 of the storage capacitor Cst. As such, the storage capacitor Cst and the first thin-film transistor TFT1 may overlap. However, the present disclosure is not limited thereto. For example, in one or more embodiments, the storage capacitor Cst may not overlap the first thin-film transistor TFT1. The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multilayer structure including such a material.

The first inorganic insulating layer 115 may cover the upper electrode CE2. According to an embodiment, the first inorganic insulating layer 115 may cover the first gate electrode GE1. The first inorganic insulating layer 115 may include $SiO_2$, $SiN_x$, SiON, $Al_2O_3$, $TiO_2$, $Ta_2O_5$, $HfO_2$, or $ZnO_x$. The first inorganic insulating layer 115 may be a single layer or multilayer structure including the inorganic insulating material described above.

The second semiconductor layer Act2 may be disposed on the first inorganic insulating layer 115. According to an embodiment, the second semiconductor layer Act2 may include a channel region, a source region, and a drain region. The source region and the drain region may be arranged at opposite sides of the channel region. The second semiconductor layer Act2 may include an oxide semiconductor. For example, the second semiconductor layer Act2 may include a Zn oxide-based material such as a Zn oxide, an In—Zn oxide, or a Ga—In—Zn oxide. In one or more embodiments, the second semiconductor layer Act2 may include an In—Ga—Zn—O (IGZO), In—Sn—Zn—O (ITZO), or an In—Ga—Sn—Zn—O (IGTZO) semiconductor where a metal such as indium (In), gallium (Ga), or tin (Sn) is contained in ZnO.

The source region and drain region of the second semiconductor layer Act2 may be formed by conducting the oxide semiconductor by adjusting carrier concentration thereof. For example, the source region and drain region of the second semiconductor layer Act2 may be formed by increasing the carrier concentration by performing a plasma process on the oxide semiconductor by using a hydrogen-based gas, a fluorine-based gas, or a combination thereof.

The second inorganic insulating layer 117 may cover the second semiconductor layer Act2. The second inorganic insulating layer 117 may be arranged between the second semiconductor layer Act2 and the second gate electrode GE2. According to an embodiment, the second inorganic insulating layer 117 may be entirely disposed on the substrate 100. According to an embodiment, the second inorganic insulating layer 117 may be patterned according to a shape of the second gate electrode GE2. The second inorganic insulating layer 117 may include $SiO_2$, $SiN_x$, SiON, $Al_2O_3$, $TiO_2$, $Ta_2O_5$, $HfO_2$, or $ZnO_x$. The second inorganic insulating layer 117 may be a single layer or multilayer structure including the inorganic insulating material described above.

The second gate electrode GE2 may be disposed on the second inorganic insulating layer 117. The second gate electrode GE2 may overlap the second semiconductor layer Act2. The second gate electrode GE2 may overlap the channel region of the second semiconductor layer Act2. The second gate electrode GE2 may include a conductive material including molybdenum (Mo), aluminum (Al), copper (Cu), or titanium (Ti), and may include a multilayer or single layer structure including the conductive material.

The interlayer insulating layer 119 may cover the second gate electrode GE2. The interlayer insulating layer 119 may include $SiO_2$, $SiN_x$, SiON, $Al_2O_3$, $TiO_2$, $Ta_2O_5$, $HfO_2$, or $ZnO_x$. The interlayer insulating layer 119 may be a single layer or multilayer structure including the inorganic insulating material described above.

The first source electrode SE1 and the first drain electrode DE1 may be disposed on the interlayer insulating layer 119. The first source electrode SE1 and the first drain electrode DE1 may be connected to the first semiconductor layer Act1. The first source electrode SE1 and the first drain electrode DE1 may be connected to the first semiconductor layer Act1 through contact holes of insulating layers. For example, the first source electrode SE1 and the first drain electrode DE1 may be connected to the first semiconductor layer Act1 through contact holes extending through or penetrating the first gate insulating layer 112, the second gate insulating layer 113, the first inorganic insulating layer 115, the second inorganic insulating layer 117, and the interlayer insulating layer 119.

The second source electrode SE2 and the second drain electrode DE2 may be disposed on the interlayer insulating layer 119. The second source electrode SE2 and the second drain electrode DE2 may be connected (e.g., electrically connected) to the second semiconductor layer Act2. The second source electrode SE2 and the second drain electrode DE2 may be connected (e.g., electrically connected) to the second semiconductor layer Act2 through contact holes of insulating layers. For example, the second source electrode SE2 and the second drain electrode DE2 may be connected to the second semiconductor layer Act2 through contact holes extending through or penetrating the second inorganic insulating layer 117 and the interlayer insulating layer 119.

The first source electrode SE1, the first drain electrode DE1, the second source electrode SE2, and the second drain electrode DE2 may each include a material having high conductivity. The first source electrode SE1, the first drain electrode DE1, the second source electrode SE2, and the second drain electrode DE2 may each include a conductive material including molybdenum (Mo), aluminum (Al), copper (Cu), or titanium (Ti), and each include a multilayer or single layer structure including the conductive material. According to an embodiment, the first source electrode SE1, the first drain electrode DE1, the second source electrode SE2, and the second drain electrode DE2 may have a multilayer structure of Ti/Al/Ti.

The first thin-film transistor TFT1 including the first semiconductor layer Act1 including a silicon semiconductor may have high reliability. Accordingly, when the first thin-film transistor TFT1 is employed as a driving thin-film transistor, the display panel 10 of high quality may be realized.

Because an oxide semiconductor has high carrier mobility and a low leakage current, a voltage drop may not be large even when a driving time is long. In other words, a color change of an image caused by the voltage drop is not large even during low-frequency driving, and thus the low-frequency driving is possible. As such, the oxide semiconductor has the low leakage current, and thus the leakage current may be prevented or reduced while reducing power consumption by employing the oxide semiconductor for at least one of thin-film transistors other than the driving thin-film transistor. For example, the second thin-film transistor TFT2 may be employed as a switching thin-film transistor.

A lower gate electrode BGE may be disposed below the second semiconductor layer Act2. According to an embodiment, the lower gate electrode BGE may be arranged between the second gate insulating layer 113 and the first inorganic insulating layer 115. According to an embodiment, the lower gate electrode BGE may receive a gate signal. In this case, the second thin-film transistor TFT2 may have a double gate electrode structure in which gate electrodes are arranged at an upper portion and a lower portion of the second semiconductor layer Act2.

According to an embodiment, a gate wire GWL may be arranged between the second inorganic insulating layer 117 and the interlayer insulating layer 119. According to an embodiment, the gate wire GWL may be connected (e.g., electrically connected) to the lower gate electrode BGE through contact holes provided in the first inorganic insulating layer 115 and second inorganic insulating layer 117.

According to an embodiment, a lower shielding layer BSL may be arranged between the substrate 100 and the pixel circuit PC. According to an embodiment, the lower shielding layer BSL may overlap the first thin-film transistor TFT1. A constant voltage may be applied to the lower shielding layer BSL. The lower shielding layer BSL is arranged at a lower portion of the first thin-film transistor TFT1, and thus effects of peripheral interference signals on the first thin-film transistor TFT1 are reduced, thereby increasing reliability.

The lower shielding layer BSL may include a transparent conductive material. According to an embodiment, the lower shielding layer BSL may include a transparent conducting oxide. For example, the lower shielding layer BSL may include a conducting oxide, such as ITO, IZO, ZnO, $In_2O_3$, IGO, or AZO.

The first organic insulating layer OIL1 may cover the first source electrode SE1, the first drain electrode DE1, the second source electrode SE2, and the second drain electrode DE2. The first organic insulating layer OIL1 may include an organic material. For example, the first organic insulating layer OIL1 may include an organic insulating material, such as a general-purpose polymer, for example, polymethylmethacrylate (PMMA) or polystyrene (PS), a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

The connecting electrode CM may be disposed on the first organic insulating layer OIL1. Here, the connecting electrode CM may be connected to the first drain electrode DE1 or the first source electrode SE1 via a contact hole of the first organic insulating layer OIL1. The connecting electrode CM may include a material having high conductivity. The connecting electrode CM may include a conductive material including molybdenum (Mo), aluminum (Al), copper (Cu), or titanium (Ti), and may include a multilayer or single layer structure including the conductive material. According to an embodiment, the connecting electrode CM may have a multilayer structure of Ti/Al/Ti.

The second organic insulating layer OIL2 and the third organic insulating layer OIL3 may be arranged while covering the connecting electrode CM. The second organic insulating layer OIL2 and the third organic insulating layer OIL3 may include an organic material. For example, the second organic insulating layer OIL2 and the third organic insulating layer OIL3 may each include an organic insulating material, such as a general-purpose polymer, for example, PMMA or PS, a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof.

The display element layer DEL may be disposed on the pixel circuit layer PCL. The display element layer DEL may include a display element. According to an embodiment, the display element layer DEL may include an organic light-emitting diode OLED as the display element. The organic light-emitting diode OLED may be disposed on the third organic insulating layer OIL3.

The organic light-emitting diode OLED may be connected (e.g., electrically connected) to the pixel circuit PC. The organic light-emitting diode OLED may realize the third pixel PX3 by being connected (e.g., electrically connected) to the pixel circuit PC arranged in the third area AR3. The organic light-emitting diode OLED may include a pixel electrode 211, an emission layer 212, and an opposing electrode 213.

The pixel electrode 211 may be disposed on the third organic insulating layer OIL3. The pixel electrode 211 may be connected (e.g., electrically connected) to the connecting electrode CM through contact holes provided in the second organic insulating layer OIL2 and third organic insulating layer OIL3.

The pixel electrode 211 may include a conducting oxide, such as ITO, IZO, ZnO, $In_2O_3$, IGO, or AZO. According to another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to another embodiment, the pixel electrode 211 may further include a layer formed of ITO, IZO, $ZnO_x$, or $In_2O_3$, on/below the reflective layer.

A pixel-defining layer 215 may include an opening 2150P exposing a center portion of the pixel electrode 211, and may be disposed on the pixel electrode 211. The opening 2150P may define an emission area of a light emitted from the organic light-emitting diode OLED.

The pixel-defining layer 215 may include an organic insulating material. According to another embodiment, the pixel-defining layer 215 may include an inorganic insulating material, such as $SiN_x$, SiON, or $SiO_2$. According to another embodiment, the pixel-defining layer 215 may include an organic insulating material and an inorganic insulating material. According to one or more embodiments, the pixel-defining layer 215 may include a light-blocking material and be provided in black. The light-blocking material may include a resin or paste including carbon black, carbon nano tube, or black pigment. The light-blocking material may include a metal particle, such as nickel (Ni), aluminum (Al), molybdenum (Mo), or an alloy thereof, a metal oxide particle (e.g., chrome oxide), or a metal nitride particle (e.g., chrome nitride). When the pixel-defining layer 215 includes the light-blocking material, external light reflection caused by metal structures arranged at a lower portion of the pixel-defining layer 215 may be reduced.

The emission layer 212 may be disposed on the pixel electrode 211. The emission layer 212 may overlap the opening 2150P. The emission layer 212 may include a low-molecular or high-molecular material, and emit red light, green light, blue light, or white light.

According to one or more embodiments, a hole injection layer (HIL) and/or a hole transport layer (HTL) may be arranged between the pixel electrode 211 and the emission layer 212. According to an embodiment, the HTL may include poly(3,4-ethylenedioxythiophene) polystyrene sulfonate (PEDOT), and the emission layer 212 may include a high-molecular material, such as poly-phenylenevinylene (PPV)-based and polyfluorene-based material.

The opposing electrode 213 may be disposed on the emission layer 212. The opposing electrode 213 may include a conductive material with a low work function. For example, the opposing electrode 213 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In one or more embodiments, the opposing electrode 213 may further include a layer including ITO, IZO, ZnO, or $In_2O_3$, on the (semi-) transparent layer including the above material.

According to one or more embodiments, an electron transport layer (ETL) and/or an electron injection layer (EIL) may be arranged between the emission layer 212 and the opposing electrode 213.

Figure 6A:
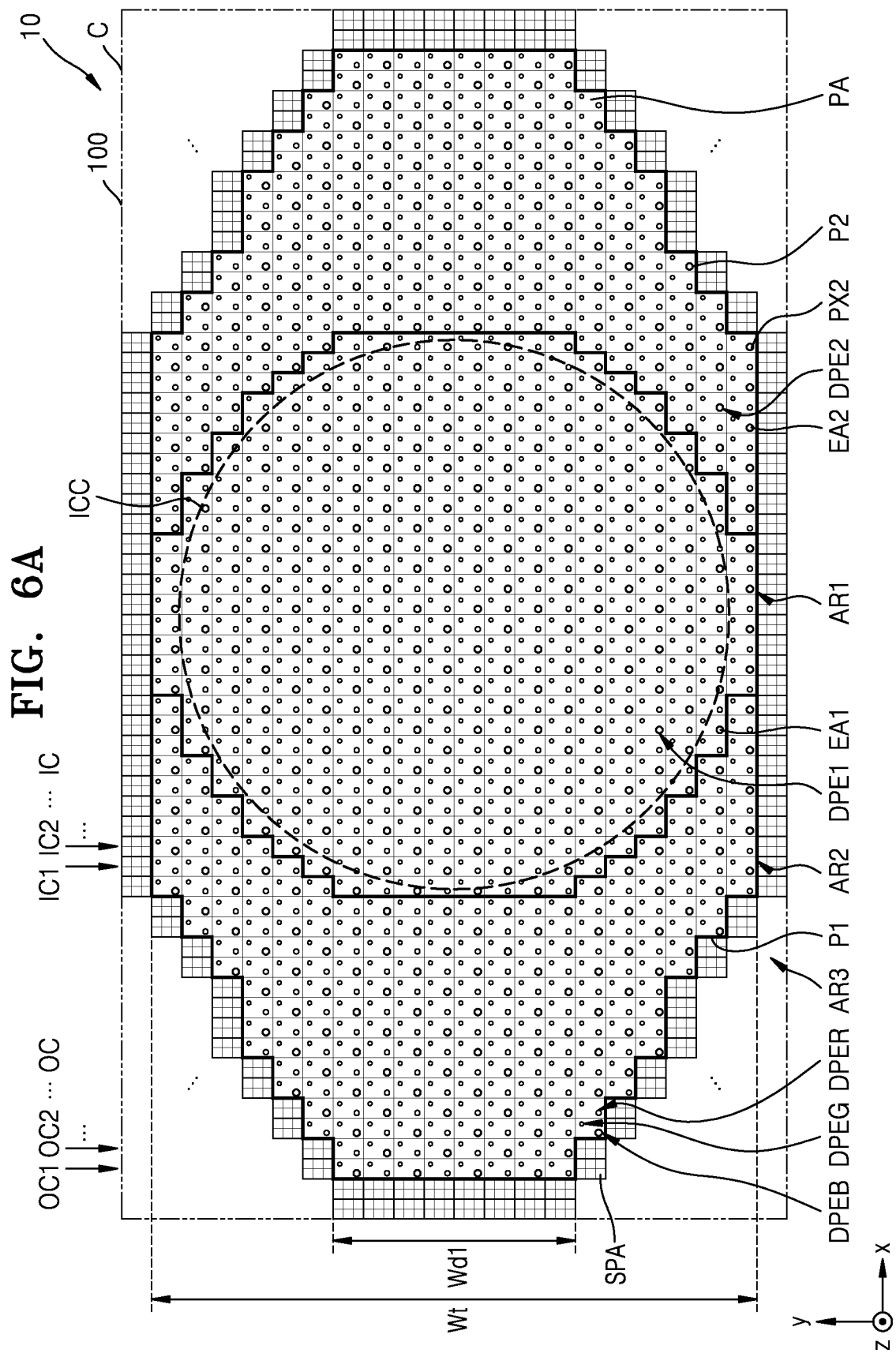
FIG. 6A is an enlarged view of a portion C of the display panel of FIG. 4, according to an embodiment.
Figure 6B:
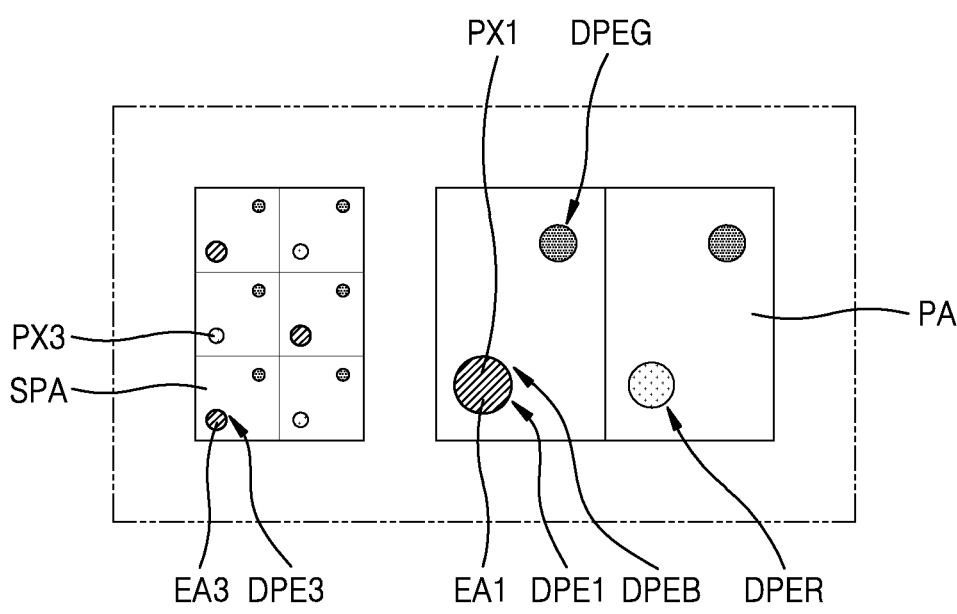
FIG. 6B is an enlarged view of a pixel area and a reduced pixel area of FIG. 6A.

FIG. 6A is an enlarged view of a portion C of the display panel 10 of FIG. 4, according to an embodiment. FIG. 6B is an enlarged view of a pixel area PA and a reduced pixel area SPA of FIG. 6A.

Referring to FIGS. 6A and 6B, the display panel 10 may include the substrate 100, the first display element DPE1, the second display element DPE2, and the third display element DPE3. The substrate 100 may include the first area AR1, the second area AR2, and the third area AR3. The first area AR1 may be an area overlapping the component. According to an embodiment, the first area AR1 may have a circular shape or a polygonal shape close to a circle. According to an embodiment, the first area AR1 may have a polygonal shape overlapping a virtual circle ICC.

The second area AR2 may be around (e.g., at least partially surround) the first area AR1. According to an embodiment, the second area AR2 may include a first portion P1 and a second portion P2 arranged with the first area AR1 therebetween. The first portion P1 may be adjacent to the first area AR1 at one side of the first area AR1, and the second portion P2 may be adjacent to the first area AR1 at another side (e.g., an opposite side) of the first area AR1. In FIG. 6A, the first portion P1 and the second portion P2 are spaced from each other, but according to another embodiment, the first portion P1 and the second portion P2 may be one area (e.g., the first portion P1 and the second portion P2 may form a single, continuous area). In this case, the second area AR2 may entirely surround the first area AR1.

The first area AR1 and the second area AR2 may include a plurality of the pixel areas PA. The plurality of pixel areas PA may be arranged in the first direction (e.g., the x or −x direction) and/or the second direction (e.g., the y or −y direction). In other words, it may be described that the plurality of pixel areas PA are arranged in a plurality of columns and a plurality of rows. According to an embodiment, the first direction (e.g., the x or −x direction) and the second direction (e.g., the y or −y direction) may perpendicularly cross each other.

The numbers of plurality of pixel areas PA arranged in the first direction (e.g., the x or −x direction) may at least partially vary in the second direction (e.g., they or −y direction). For example, the number of plurality of pixel areas PA arranged in the first direction (e.g., the x or −x direction) and crossing the center of the first area AR1 may be greater than the number of plurality of pixel areas PA arranged in the first direction (e.g., the x or −x direction) and crossing the edge of the first area AR1.

The numbers of plurality of pixel areas PA arranged in the second direction (e.g., the y or −y direction) may at least partially vary in the first direction (e.g., the x or −x direction). For example, the number of plurality of pixel areas PA arranged in the second direction (e.g., the y or −y direction) and crossing the center of the first area AR1 may be greater than the number of plurality of pixel areas PA arranged in the second direction (e.g., the y or −y direction) and crossing the edge of the second area AR2.

An outer column OC may be a column spaced from the first area AR1. The outer column OC may extend in the second direction (e.g., the y or −y direction) and may be spaced from the first area AR1 in the first direction (e.g., the x or −x direction). The outer column OC may overlap some of the plurality of pixel areas PA arranged in the second area AR2. There may be a plurality of outer columns OC. For example, the outer column OC may include a first outer column OC1 and a second outer column OC2.

An inner column IC may be a column at least partially overlapping the first area AR1. The inner column IC may extend in the second direction (e.g., the y or −y direction). The inner column IC may overlap other some of the plurality of pixel areas PA arranged in the first area AR1 and the plurality of pixel areas PA arranged in the second area AR2. There may be a plurality of inner columns IC. For example, the inner column IC may include a first inner column IC1 and a second inner column IC2.

A width Wd1 of the second area AR2 in the first outer column OC1 may be smaller than (e.g., less than) a sum Wt of a width of the first area AR1 and a width of the second area AR2 in the first inner column IC1. The width Wd1 of the second area AR2 in the first outer column OC1 may be a length of the second area AR2 in the second direction (e.g., the y or −y direction). The sum Wt of the widths of the first area AR1 and second area AR2 in the first inner column IC1 may be a sum of a length of the first area AR1 in the second direction (e.g., the y or −y direction) and a length of the second area AR2 in the second direction (e.g., the y or −y direction) in the first inner column IC1. According to an embodiment, the number of the plurality of pixel areas PA in the first outer column OC1 may be smaller (e.g., less than) than the number of the plurality of pixel areas PA in the first inner column IC1.

The third area AR3 may be around (e.g., at least partially surround) the second area AR2. According to an embodiment, the third area AR3 may be around (e.g., at least partially surround) the first area AR1 and the second area AR2. For example, the third area AR3 may entirely surround the first area AR1 and the second area AR2.

The third area AR3 may include a plurality of the reduced pixel areas SPA. The plurality of reduced pixel areas SPA may be arranged in the first direction (e.g., the x or −x direction) and/or the second direction (e.g., the y or −y direction). According to an embodiment, an area of the reduced pixel area SPA may be smaller than an area of the pixel area PA. For example, the area of the pixel area PA may be six times greater than the area of the reduced pixel area SPA. In this case, the length of the pixel area PA in the first direction (e.g., the x or −x direction) may correspond to a length of two reduced pixel areas SPA arranged in the first direction (e.g., the x or −x direction). The length of the pixel area PA in the second direction (e.g., the y or −y direction) may correspond to a length of three reduced pixel areas SPA in the second direction (e.g., the y or −y direction).

The first display element DPE1 may be arranged in the first area AR1. According to an embodiment, there may be a plurality of the first display elements DPE1, and the plurality of first display elements DPE1 may be arranged in the first area AR1. According to an embodiment, the first display element DPE1 may emit blue light, green light, or red light. According to another embodiment, the first display element DPE1 may emit blue light, green light, red light, or white light. The first display element DPE1 may include a first emission area EA1. The first emission area EA1 may be an area in which the first display element DPE1 emits light. Accordingly, the first display element DPE1 may realize the first pixel PX1.

The first display element DPE1 may be arranged in the pixel area PA overlapping the first area AR1. According to an embodiment, one first display element DPE1 may be arranged in one pixel area PA. According to another embodiment, the plurality of first display elements DPE1 may be arranged in one pixel area PA. For example, the first display element DPE1 emitting blue light and the first display element DPE1 emitting green light may be arranged in one pixel area PA. In other words, a blue display element DPEB and a green display element DPEG may be arranged in one pixel area PA. The first display element DPE1 emitting blue light and the first display element DPE1 emitting green light may each be arranged adjacent to a corner of the pixel area PA. For example, the first display element DPE1 emitting blue light and the first display element DPE1 emitting green light may be adjacent to separate corners of the pixel area PA with a center point of the pixel area PA therebetween. As another example, the first display element DPE1 emitting red light and the first display element DPE1 emitting green light may be arranged in one pixel area PA. In other words, a red display element DPER and the green display element DPEG may be arranged in one pixel area PA. The first display element DPE1 emitting red light and the first display element DPE1 emitting green light may each be arranged adjacent to a corner of the pixel area PA. For example, the first display element DPE1 emitting red light and the first display element DPE1 emitting green light may be adjacent to separate corners of the pixel area PA with a center point of the pixel area PA therebetween.

According to an embodiment, an area of the blue display element DPEB may be greater than an area of the red display element DPER. According to an embodiment, the area of the red display element DPER may be greater than an area of the green display element DPEG.

According to an embodiment, the first display element DPE1 emitting blue light and the first display element DPE1 emitting green light may be arranged in one pixel area PA. The first display element DPE1 emitting red light and the first display element DPE1 emitting green light may be arranged in the pixel area PA adjacent to the one pixel area PA.

The second display element DPE2 may be arranged in the second area AR2. According to an embodiment, there may be a plurality of the second display elements DPE2, and the plurality of second display elements DPE2 may be arranged in the second area AR2. According to an embodiment, the second display element DPE2 may emit blue light, green light, or red light. According to another embodiment, the second display element DPE2 may emit blue light, green light, red light, or white light. The second display element DPE2 may include a second emission area EA2. The second emission area EA2 may be an area in which the second display element DPE2 emits light. Accordingly, the second display element DPE2 may realize the second pixel PX2. According to an embodiment, an arrangement of the second display element DPE2 in the second area AR2 may be the same as or similar to an arrangement of the first display element DPE1 in the first area AR1.

According to an embodiment, the first display element DPE1 emitting green light and the second display element DPE2 emitting green light may be arranged in parallel in the first direction (e.g., the x or −x direction) and/or the second direction (e.g., the y or −y direction). The first display element DPE1 emitting blue light or red light and the second display element DPE2 emitting blue light or red light may be arranged in parallel in the first direction (e.g., the x or −x direction) and/or the second direction (e.g., the y or −y direction). Such arrangements of the first display element DPE1 and second display element DPE2 may be referred to as a Pentile Matrix™ structure or an RGBG matrix structure.

The third display element DPE3 may be arranged in the third area AR3. According to an embodiment, there may be a plurality of the third display elements DPE3, and the plurality of third display elements DPE3 may be arranged in the third area AR3. According to an embodiment, the third display element DPE3 may emit blue light, green light, or red light. According to another embodiment, the third display element DPE3 may emit blue light, green light, red light, or white light. The third display element DPE3 may include a third emission area EA3. The third emission area EA3 may be an area in which the third display element DPE3 emits light. Accordingly, the third display element DPE3 may realize the third pixel PX3. According to an embodiment, the plurality of third display elements DPE3 may be arranged in the Pentile Matrix™ structure or an RGBG matrix structure.

The third emission area EA3 may be smaller than one of the first emission area EA1 and the second emission area EA2. In this case, the number of third pixels PX3 per unit area in the third area AR3 may be greater than the number of first pixels PX1 per unit area in the first area AR1. The number of third pixels PX3 per unit area in the third area AR3 may be greater than the number of second pixels PX2 per unit area in the second area AR2. Accordingly, resolution of the display panel 10 in the third area AR3 may be higher than resolution of the display panel 10 in the first area AR1 and resolution of the display panel 10 in the second area AR2.

Unlike the described embodiment, the second area AR2 may have a rectangular shape when the second area AR2 is arranged only at one side and the other side of the first area AR1 without at least partially surrounding the outer circumference (e.g., the outer periphery) of the first area AR1. In this case, an area occupied by the first area AR1 and the second area AR2 may be increased, and thus the first area AR1 and the second area AR2 may be easily recognized by a user according to a resolution difference from the third area AR3. In one or more embodiments, the width Wd1 of the second area AR2 in the first outer column OC1 may be smaller than (e.g., less than) the sum Wt of the width of the first area AR1 and the width of the second area AR2 in the first inner column IC1. Accordingly, even when the first area AR1 and second area AR2 have the resolution difference from the third area AR3, the first area AR1 and second area AR2 may not be easily recognized by the user and aesthetics may be improved.

Figure 7:
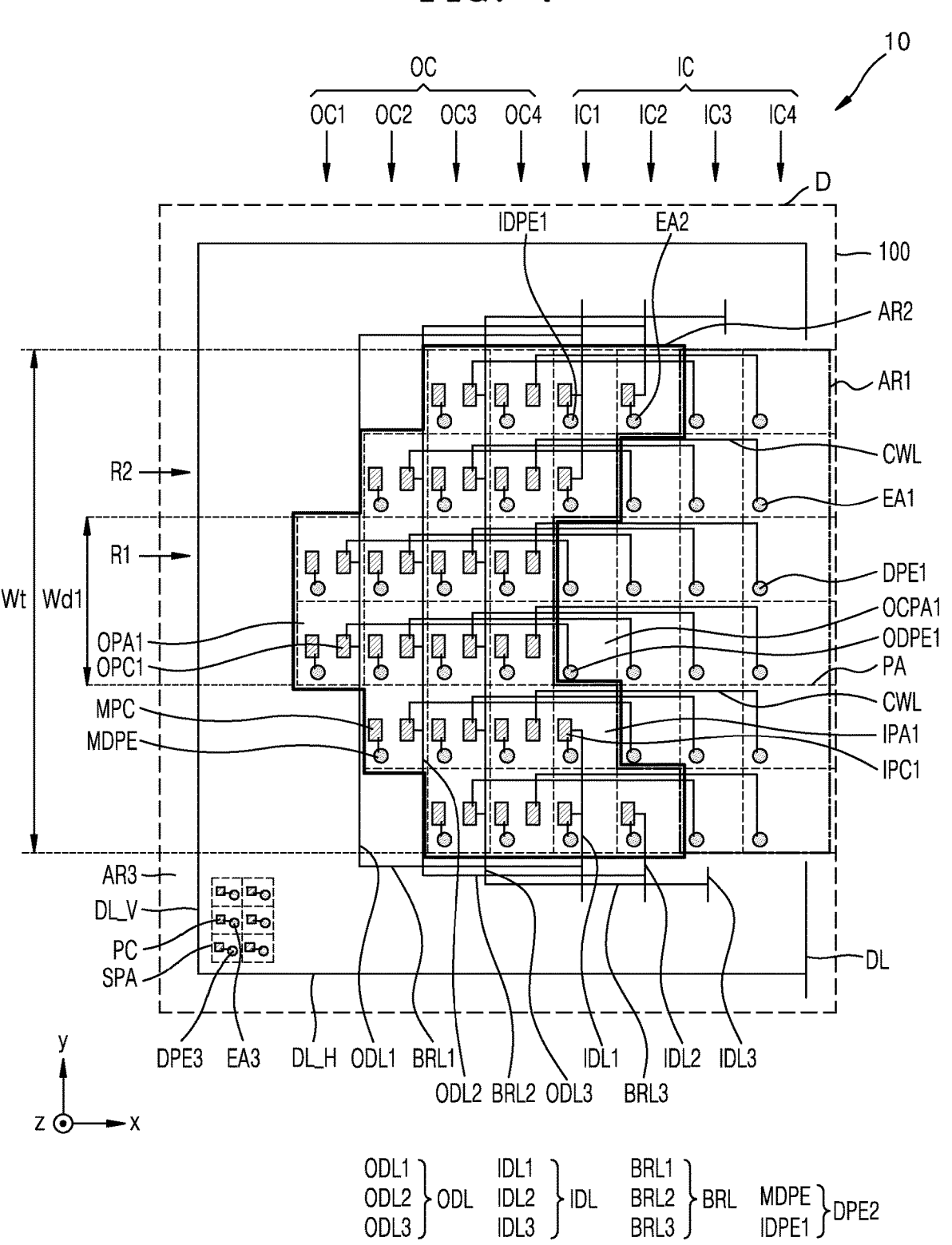
FIG. 7 is an enlarged view of a portion D of the display panel of FIG. 4, according to an embodiment.
Figure 8:
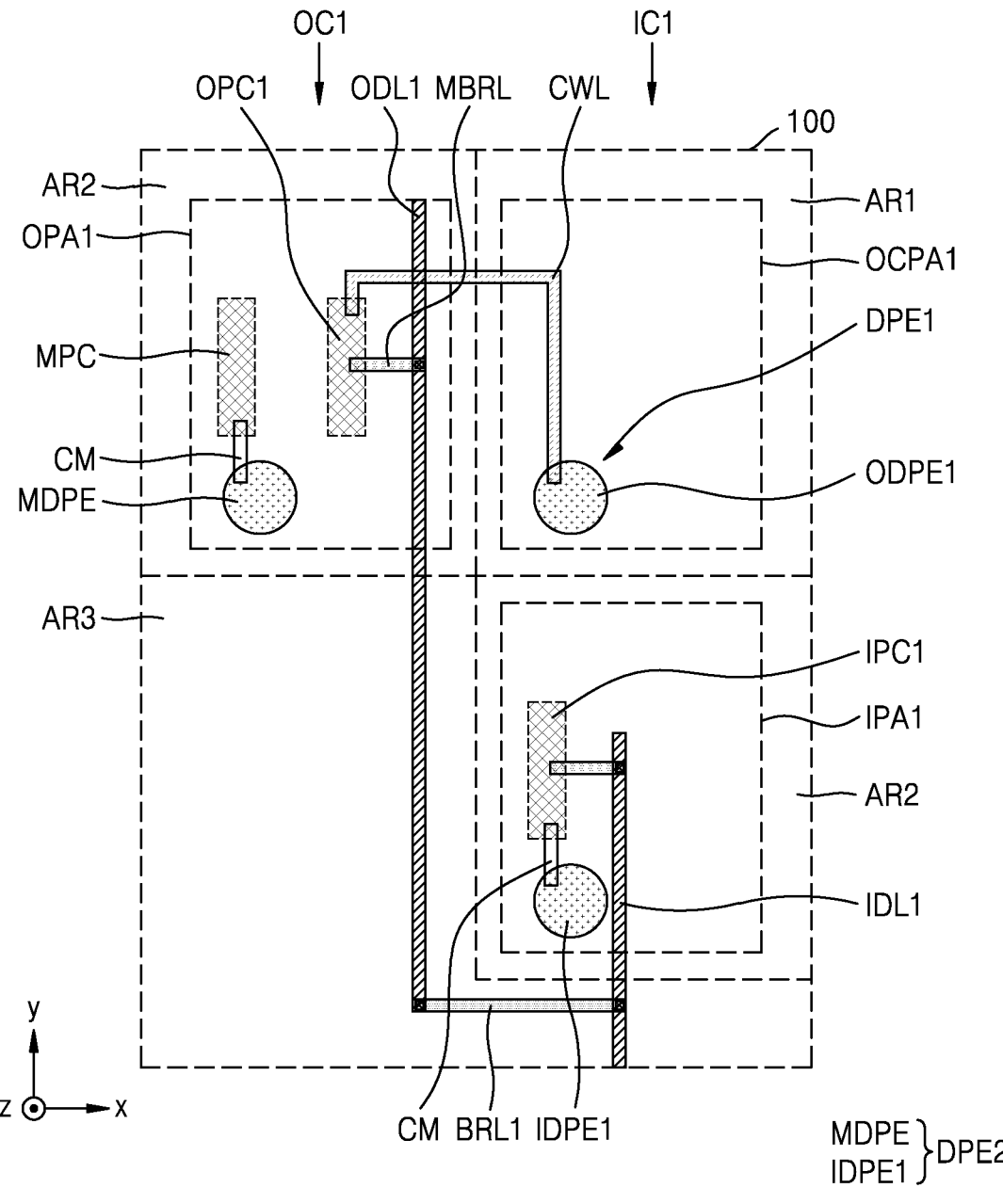
FIG. 8 is an enlarged view of a first outer pixel area, a first outer corresponding pixel area, and a first inner pixel area of FIG. 7, according to an embodiment.

FIG. 7 is an enlarged view of a portion D of the display panel 10 of FIG. 4, according to an embodiment. FIG. 8 is an enlarged view of a first outer pixel area OPA1, a first outer corresponding pixel area OCPA1, and a first inner pixel area IPA1 of FIG. 7, according to an embodiment. In FIGS. 7 and 8, like reference numerals as FIGS. 6A and 6B denote like elements, and thus redundant descriptions thereof may not be repeated.

Referring to FIGS. 7 and 8, the display panel 10 may include the substrate 100, an outer data line ODL, an inner data line IDL, a bridge wire BRL, a first outer pixel circuit OPC1, a first inner pixel circuit IPC1, an intermediate pixel circuit MPC, the connecting wire CWL, the first display element DPE1, the second display element DPE2, and the third display element DPE3. The substrate 100 may include the first area AR1, the second area AR2, and the third area AR3. The second area AR2 may be around (e.g., at least partially surround) the first area AR1.

The first area AR1 and the second area AR2 may include the plurality of pixel areas PA. The plurality of pixel areas PA may be arranged in the first direction (e.g., the x or −x direction) and/or the second direction (e.g., the y or −y direction). In other words, the plurality of pixel areas PA are arranged along the plurality of columns and the plurality of rows.

The outer column OC may be a column spaced from the first area AR1. The outer column OC may extend in the second direction (e.g., they or −y direction) and may be spaced from the first area AR1 in the first direction (e.g., the x or −x direction). The outer column OC may overlap some of the plurality of pixel areas PA arranged in the second area AR2. There may be a plurality of outer columns OC. For example, the outer column OC may include the first outer column OC1, the second outer column OC2, a third outer column OC3, and a fourth outer column OC4.

The plurality of pixel areas PA may include the first outer pixel area OPA1 overlapping the first outer column OC1. According to an embodiment, the plurality of pixel areas PA may include the first outer pixel area OPA1 overlapping the first outer column OC1, a second outer pixel area overlapping the second outer column OC2, a third outer pixel area overlapping the third outer column OC3, and a fourth outer pixel area overlapping the fourth outer column OC4.

The inner column IC may be a column at least partially overlapping the first area AR1. The inner column IC may extend in the second direction (e.g., the y or −y direction). The inner column IC may overlap other some of the plurality of pixel areas PA arranged in the first area AR1 and the plurality of pixel areas PA arranged in the second area AR2. There may be a plurality of inner columns IC. For example, the inner column IC may include the first inner column IC1, the second inner column IC2, a third inner column IC3, and a fourth inner column IC4.

The plurality of pixel areas PA may include the first inner pixel area IPA1 overlapping the first inner column IC1. According to an embodiment, the plurality of pixel areas PA may include the first inner pixel area IPA1 overlapping the first inner column IC1, a second inner pixel area overlapping the second inner column IC2, a third inner pixel area overlapping the third inner column IC3, and a fourth inner pixel area overlapping the fourth inner column IC4. The plurality of pixel areas PA may include the first outer corresponding pixel area OCPA1 overlapping the first inner column IC1.

The width Wd1 of the second area AR2 in the first outer column OC1 may be smaller than (e.g., less than) the sum Wt of the width of the first area AR1 and the width of the second area AR2 in the first inner column IC1. According to an embodiment, the number of the plurality of pixel areas PA in the first outer column OC1 may be smaller than (e.g., less than) the number of the plurality of pixel areas PA in the first inner column IC1.

The third area AR3 may be around (e.g., at least partially surround) the second area AR2. The third area AR3 may include the plurality of reduced pixel areas SPA. The plurality of reduced pixel areas SPA may be arranged in the first direction (e.g., the x or −x direction) and/or the second direction (e.g., the y or −y direction). According to an embodiment, the area of the reduced pixel area SPA may be smaller than the area of the pixel area PA.

The outer data line ODL may be configured to transmit a data signal and extend along the outer column OC. The outer data line ODL may extend in the second direction (e.g., the y or −y direction). The outer data line ODL may extend from the third area AR3 to the second area AR2. The outer data line ODL may overlap the second area AR2. According to an embodiment, the outer data line ODL may include a first outer data line ODL1, a second outer data line ODL2, and a third outer data line ODL3. The first outer data line ODL1 may extend along the first outer column OC1. The second outer data line ODL2 may extend along the second outer column OC2. The third outer data line ODL3 may extend along the third outer column OC3.

The inner data line IDL may extend along the inner column IC. The inner data line IDL may extend in the second direction (e.g., the y or −y direction). According to an embodiment, the inner data line IDL may include a first inner data line IDL1, a second inner data line IDL2, and a third inner data line IDL3. The first inner data line IDL1 may extend along the first inner column IC1. The second inner data line IDL2 may extend along the second inner column IC2. The third inner data line IDL3 may extend along the third inner column IC3.

The inner data line IDL may be connected (e.g., electrically connected) to the outer data line ODL. The first inner data line IDL1 may be connected (e.g., electrically connected) to the first outer data line ODL1. Accordingly, the first inner data line IDL1 and the first outer data line ODL1 may be configured to transmit a same first data signal. The second inner data line IDL2 may be connected (e.g., electrically connected) to the second outer data line ODL2. Accordingly, the second inner data line IDL2 and the second outer data line ODL2 may be configured to transmit a same second data signal. The third inner data line IDL3 may be connected (e.g., electrically connected) to the third outer data line ODL3. Accordingly, the third inner data line IDL3 and the third outer data line ODL3 may be configured to transmit a same third data signal.

The inner data line IDL may extend from the third area AR3. In one or more embodiments, the inner data line IDL may overlap the inner column IC and be connected (e.g., electrically connected) to the pixel circuit PC arranged in the third area AR3.

The outer data line ODL and the inner data line IDL may be connected (e.g., electrically connected) to the bridge wire BRL. The bridge wire BRL may extend in the first direction (e.g., the x or –x direction). The bridge wire BRL may be arranged on or at a layer different from the outer data line ODL and the inner data line IDL. According to an embodiment, an insulating layer may be disposed on the bridge wire BRL and the outer data line ODL and inner data line IDL may be disposed on the insulating layer. In this case, the bridge wire BRL and the outer data line ODL may be connected (e.g., electrically connected) to each other through a contact hole of the insulating layer. The bridge wire BRL and the inner data line IDL may be connected (e.g., electrically connected) to each other through the contact hole of the insulating layer. For example, the bridge wire BRL may be arranged between the inorganic insulating layer IIL (e.g., see FIG. 5) and the first organic insulating layer OIL1 (e.g., see FIG. 5). The outer data line ODL and the inner data line IDL may be arranged between the first organic insulating layer OIL1 (e.g., see FIG. 5) and the second organic insulating layer OIL2 (se FIG. 5).

The bridge wire BRL may include a first bridge wire BRL1, a second bridge wire BRL2, and a third bridge wire BRL3. The first bridge wire BRL1 may connect (e.g., electrically connect) the first outer data line ODL1 and the first inner data line IDL1. The second bridge wire BRL2 may connect (e.g., electrically connect) the second outer data line ODL2 and the second inner data line IDL2. The third bridge wire BRL3 may connect (e.g., electrically connect) the third outer data line ODL3 and the third inner data line IDL3.

The first outer pixel circuit OPC1 may be configured to drive the first display element DPE1 arranged in the first area AR1. The first outer pixel circuit OPC1 may be arranged in the first outer pixel area OPA1. The first outer pixel circuit OPC1 may be connected (e.g., electrically connected) to the first outer data line ODL1. The first outer pixel circuit OPC1 may be configured to receive the first data signal from the first outer data line ODL1. According to an embodiment, the first outer pixel circuit OPC1 and the first outer data line ODL1 may be connected (e.g., electrically connected) to each other through an intermediate bridge wire MBRL. According to an embodiment, the intermediate bridge wire MBRL may be arranged on or at a layer different from the first outer data line ODL1.

The first inner pixel circuit IPC1 may be configured to drive the second display element DPE2 arranged in the second area AR2. The first inner pixel circuit IPC1 may be arranged in the first inner pixel area IPA1. The first inner pixel circuit IPC1 may be connected (e.g., electrically connected) to the first inner data line IDL1. The first inner pixel circuit IPC1 may be configured to receive the first data signal from the first inner data line IDL1. Accordingly, the first inner pixel circuit IPC1 overlapping the first inner column IC1 and the first outer pixel circuit OPC1 overlapping the first outer column OC1 may be configured to receive the same first data signal even when arranged in different columns.

The intermediate pixel circuit MPC may be configured to drive the second display element DPE2 arranged in the second area AR2. The intermediate pixel circuit MPC may be arranged in the second area AR2. According to an embodiment, the intermediate pixel circuit MPC may be arranged in the first outer pixel area OPA1.

The connecting wire CWL may extend from the second area AR2 to the first area AR1. The connecting wire CWL may extend in a direction from the outer column OC to the inner column IC. The plurality of connecting wires CWL may extend in a direction where the outer column OC and the inner column IC cross each other. The connecting wire CWL may include a transparent conducting oxide.

There may be the plurality of connecting wires CWL. The number of plurality of connecting wires CWL arranged in a first row R1 crossing the first outer column OC1 may be different from the number of plurality of connecting wires CWL arranged in a second row R2 different from the first row R1. When the second row R2 is closer to an edge of the first area AR1 in the second direction (e.g., the y or –y direction) than the first row R1 is to the edge of the first area AR1, the number of plurality of connecting wires CWL arranged in the second row R2 may be less than the number of plurality of connecting wires CWL arranged in the first row R1. For example, the number of plurality of connecting wires CWL arranged in the second row R2 may be 3, and the number of plurality of connecting wires CWL arranged in the first row R1 may be 4.

The first display element DPE1 may be arranged in the first area AR1. According to an embodiment, there may be the plurality of first display elements DPE1, and the plurality of first display elements DPE1 may be arranged in the first area AR1. The first display element DPE1 may include the first emission area EA1. The first emission area EA1 may be an area in which the first display element DPE1 emits light.

The first display element DPE1 may include a first outer display element ODPE1 overlapping the first inner column IC1 and connected (e.g., electrically connected) to the first outer pixel circuit OPC1. The first outer display element ODPE1 may be arranged in the first outer corresponding pixel area OCPA1. The first outer display element ODPE1 may be connected (e.g., electrically connected) to the first outer pixel circuit OPC1 through the connecting wire CWL. Accordingly, a pixel circuit may not be arranged in the first area AR1 and light or sound transmittance of the display panel 10 in the first area AR1 may be increased.

The second display element DPE2 may be arranged in the second area AR2. According to an embodiment, there may be the plurality of second display elements DPE2, and the plurality of second display elements DPE2 may be arranged in the second area AR2. The second display element DPE2 may include the second emission area EA2. The second emission area EA2 may be an area in which the second display element DPE2 emits light.

The second display element DPE2 may include a first inner display element IDPE1 overlapping the first inner pixel area IPA1 and connected (e.g., electrically connected) to the first inner pixel circuit IPC1. The first outer pixel circuit OPC1 and the first inner pixel circuit IPC1 may be configured to receive the same first data signal. According to an embodiment, the first outer pixel circuit OPC1 and the first inner pixel circuit IPC1 may be configured to receive different scan signals from each other and operate independently.

The second display element DPE2 may include an intermediate display element MDPE arranged in the second area AR2. There may be a plurality of the intermediate display elements MDPE in the second area AR2. The intermediate display element MDPE may be connected (e.g., electrically connected) to the intermediate pixel circuit MPC. The intermediate display element MDPE may be connected (e.g., electrically connected) to the intermediate pixel circuit MPC through the connecting electrode CM.

According to an embodiment, the intermediate display element MDPE may be connected (e.g., electrically connected) to the intermediate pixel circuit MPC in the same pixel area PA. For example, the intermediate display element MDPE and the intermediate pixel circuit MPC may be arranged in the first outer pixel area OPA1 and connected (e.g., electrically connected) to each other.

The third display element DPE3 may be arranged in the third area AR3. The third display element DPE3 may be arranged in the reduced pixel area SPA. There may be a plurality of the reduced pixel areas SPA, and the plurality of reduced pixel areas SPA may surround the first area AR1 and the second area AR2. According to an embodiment, there may be a plurality of the third display elements DPE3, and the plurality of third display elements DPE3 may be arranged in the third area AR3. The third display element DPE3 may include the third emission area EA3. The third emission area EA3 may be an area in which the third display element DPE3 emits light.

The third emission area EA3 may be smaller than one of the first emission area EA1 and the second emission area EA2. In this case, the number of third display elements DPE3 per unit area in the third area AR3 may be greater than the number of first display elements DPE1 per unit area in the first area AR1.

In one or more embodiments, the width Wd1 of the second area AR2 in the first outer column OC1 may be smaller than (e.g., less than) the sum Wt of the width of the first area AR1 and the width of the second area AR2 in the first inner column IC1. Accordingly, even when the first area AR1 and second area AR2 have the resolution difference from the third area AR3, the first area AR1 and second area AR2 may not be easily recognized by the user and aesthetics may be improved.

This may be because the display panel 10 includes the first outer data line ODL1 extending along the first outer column OC1 spaced from the first area AR1, and the first inner data line IDL1 extending along the first inner column IC1 at least partially overlapping the first area AR1 and connected (e.g., electrically connected) to the first outer data line ODL1. Accordingly, the first outer pixel circuit OPC1 overlapping the first outer pixel area OPA1 and the first inner pixel circuit IPC1 overlapping the first inner pixel area IPA1 may be configured to receive the same data signal, and the second area AR2 may be around (e.g., at least partially surround) the outer circumference of the first area AR1.

The data line DL, a horizontal data line DL_H, and a vertical data line DL_V may be further arranged in the third area AR3. The data line DL may extend in the second direction (e.g., they or –y direction) in the third area AR3. According to an embodiment, the data line DL may not overlap the first area AR1.

The data line DL may be configured to transmit the data signal to the pixel circuit PC arranged in the third area AR3. According to an embodiment, although not illustrated, the data line DL may be configured to transmit the data signal to the pixel circuit PC arranged in a same column.

The data line DL may be connected (e.g., electrically connected) to the horizontal data line DL_H. The horizontal data line DL_H may extend in the first direction (e.g., the x or –x direction) in the third area AR3. The horizontal data line DL_H may be connected (e.g., electrically connected) to the vertical data line DL_V. The vertical data line DL_V may extend in the second direction (e.g., the y or –y direction) in the third area AR3.

The data line DL, the horizontal data line DL_H, and the vertical data line DL_V may bypass the first area AR1. Accordingly, even when some of the data lines DL and other some of the data lines DL arranged in a same column are disconnected based on the first area AR1, the some of the data lines DL and the other some of the data lines DL arranged in the same column may be connected (e.g., electrically connected) to each other through the horizontal data line DL_H and the vertical data line DL_V. Accordingly, the some of the data lines DL and the other some of the data lines DL arranged in the same column may be configured to transmit the same data signal.

Figure 9:
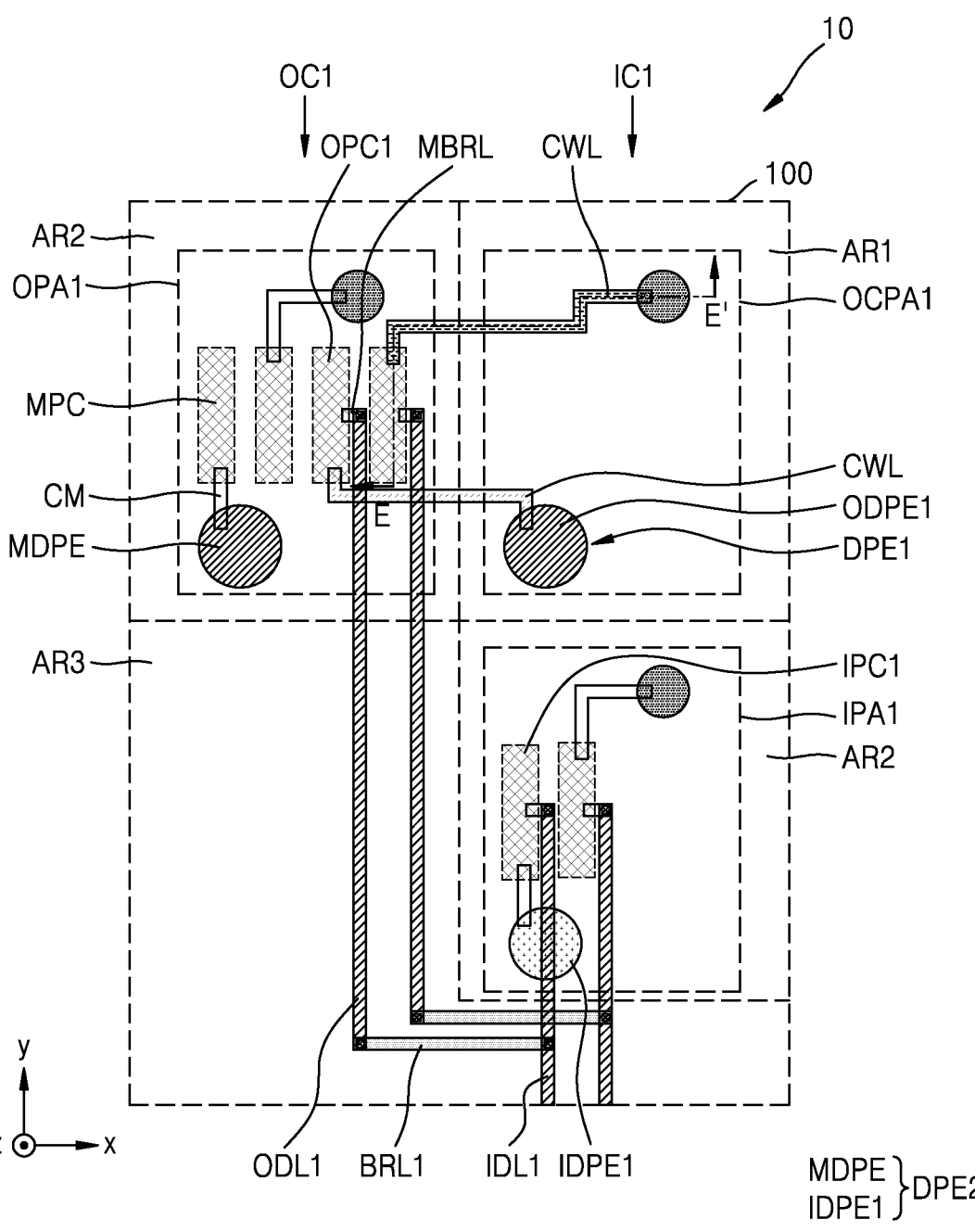
FIG. 9 is an enlarged view of the first outer pixel area, the first outer corresponding pixel area, and the first inner pixel area of FIG. 7, according to another embodiment.

FIG. 9 is an enlarged view of the first outer pixel area OPA1, the first outer corresponding pixel area OCPA1, and the first inner pixel area IPA1 of FIG. 7, according to another embodiment. In FIG. 9, like reference numerals as FIG. 8 denote like elements, and thus redundant descriptions thereof may not be repeated.

Referring to FIG. 9, the display panel 10 may include the substrate 100, the first outer data line ODL1, the first inner data line IDL1, the first outer pixel circuit OPC1, the first inner pixel circuit IPC1, the intermediate pixel circuit MPC, the connecting electrode CM, the connecting wire CWL, the first display element DPE1, and the second display element DPE2. The substrate 100 may include the first area AR1, the second area AR2, and the third area AR3. The second area AR2 may be around (e.g., at least partially surround) the first area AR1.

According to an embodiment, the first display element DPE1 may emit blue light, green light, or red light. According to another embodiment, the first display element DPE1 may emit blue light, green light, red light, or white light.

There may be the plurality of first display elements DPE1, and the plurality of first display elements DPE1 may be arranged in the first area AR1. The plurality of first display element DPE1 may be arranged in the Pentile Matrix™ structure or an RGBG matrix structure. According to an embodiment, the plurality of first display elements DPE1 may be arranged in the first outer corresponding pixel area OCPA1. One of the plurality of first display elements DPE1 arranged in one pixel area may emit blue light or red light. Another one of the plurality of first display elements DPE1 arranged in the one pixel area may emit green light.

According to an embodiment, the second display element DPE2 may emit blue light, green light, or red light. According to another embodiment, the second display element DPE2 may emit blue light, green light, red light, or white light.

There may be the plurality of second display elements DPE2, and the plurality of second display elements DPE2 may be arranged in the second area AR2. The plurality of second display elements DPE2 may be arranged in the Pentile Matrix™ structure or an RGBG matrix structure. According to an embodiment, the plurality of second display elements DPE2 may be arranged in the first outer pixel area OPA1 and the first inner pixel area IPA1. According to an embodiment, one of the plurality of second display elements DPE2 arranged in one pixel area may emit blue light or red light. Another one of the plurality of second display elements DPE2 arranged in the one pixel area may emit green light.

Accordingly, there may be pluralities of first outer pixel circuits OPC1, first inner pixel circuits IPC1, intermediate pixel circuits MPC, connecting electrodes CM, and connecting wires CWL per pixel area. There may be pluralities of first outer data lines ODL1 and first inner data lines IDL1 per column.

Figure 10A:
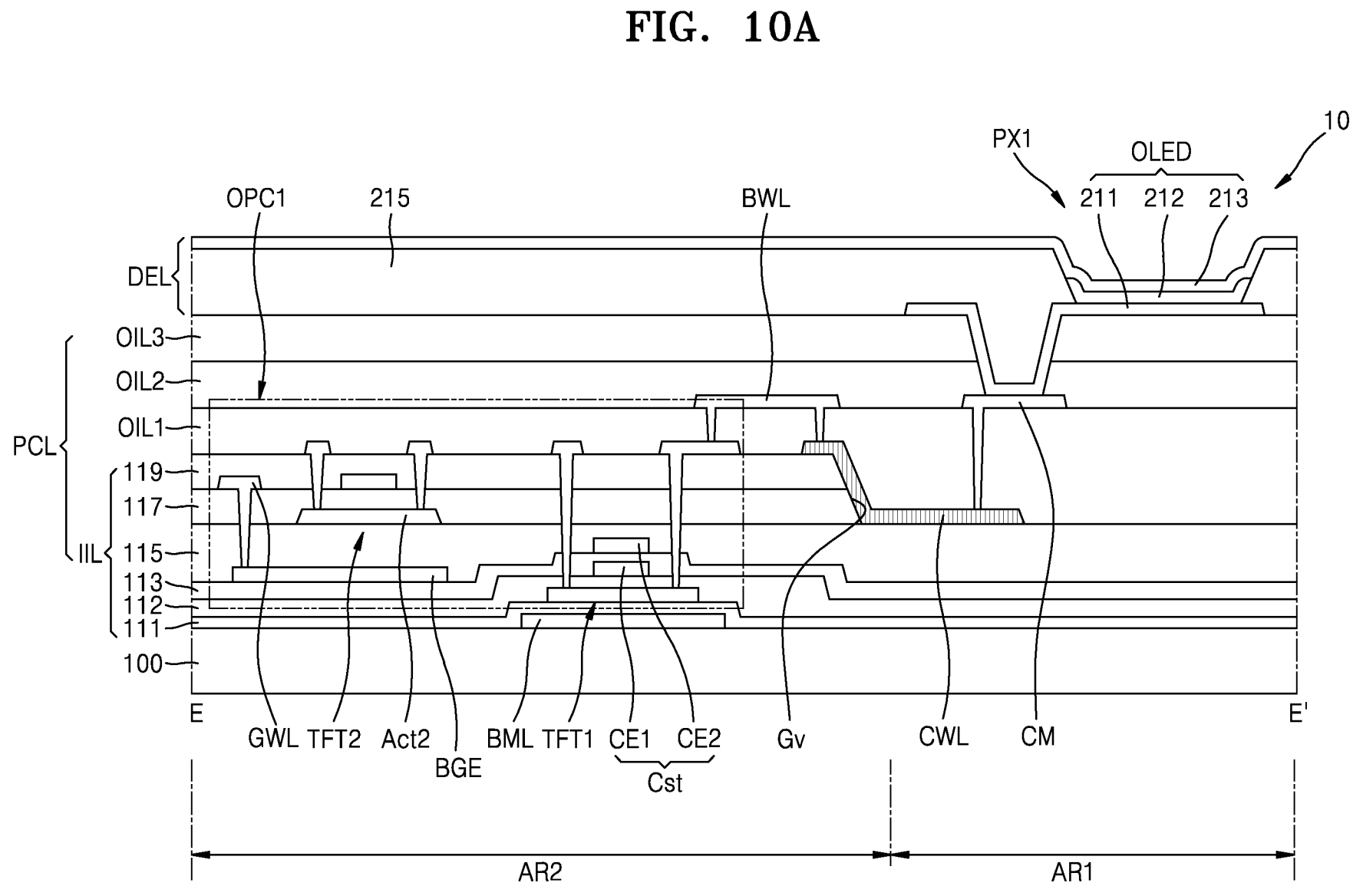
Figure 10B:
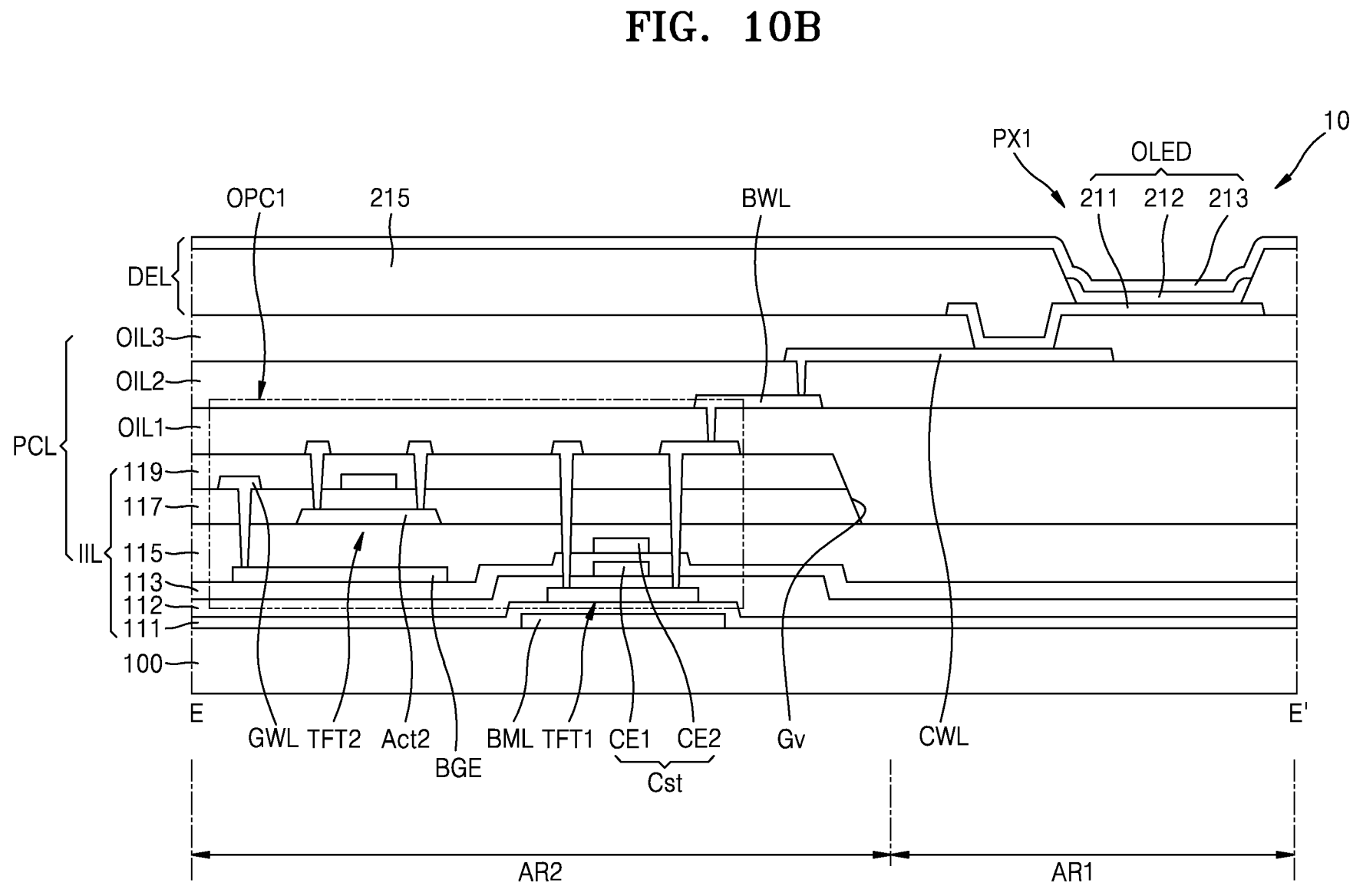

FIGS. 10A and 10B are cross-sectional views of the display panel 10 taken along the line E-E' of FIG. 9. In FIGS. 10A and 10B, like reference numerals as FIG. 5 denote like elements, and thus redundant descriptions thereof may not be repeated.

Referring to FIGS. 10A and 10B, the display panel 10 may include the substrate 100, the pixel circuit layer PCL, and the display element layer DEL. The display element layer DEL may include the organic light-emitting diode OLED as a first display element. The organic light-emitting diode OLED, as the first display element, may realize the first pixel PX1. The substrate 100 may include the first area AR1 and the second area AR2.

The pixel circuit layer PCL may be disposed on the substrate 100. The pixel circuit layer PCL may include the first outer pixel circuit OPC1, the inorganic insulating layer IIL, the connecting wire CWL, the first organic insulating layer OIL1, a connecting bridge wire BWL, the connecting electrode CM, the second organic insulating layer OIL2, and the third organic insulating layer OIL3. According to an embodiment, the inorganic insulating layer IIL may include the buffer layer 111, the first gate insulating layer 112, the second gate insulating layer 113, the first inorganic insulating layer 115, the second inorganic insulating layer 117, and the interlayer insulating layer 119.

The first outer pixel circuit OPC1 may be arranged in the second area AR2. The first outer pixel circuit OPC1 may not be arranged in the first area AR1. The first outer pixel circuit OPC1 may include the first thin-film transistor TFT1, the second thin-film transistor TFT2, and the storage capacitor Cst.

According to an embodiment, the inorganic insulating layer IIL may include a groove Gv or a hole overlapping the first area AR1. The groove Gv may have a shape obtained by removing a part of the inorganic insulating layer IIL. For example, the buffer layer 111, the first gate insulating layer 112, the second gate insulating layer 113, and the first inorganic insulating layer 115 may be consecutively arranged in the first area AR1 and the second area AR2. The second inorganic insulating layer 117 and the interlayer insulating layer 119 may each include an opening overlapping the first area AR1. The opening of the second inorganic insulating layer 117 and the opening of the interlayer insulating layer 119 may be separately formed through separate processes or concurrently (e.g., simultaneously) formed through a same process. When the opening of the second inorganic insulating layer 117 and the opening of the interlayer insulating layer 119 are separately formed through separate processes, the groove Gv may have a stepped shape.

The first organic insulating layer OIL1 may fill the groove Gv. The first organic insulating layer OIL1 may have higher transmittance (e.g., light transmittance) than the second inorganic insulating layer 117 and/or the interlayer insulating layer 119. Accordingly, transmittance (e.g., light transmittance) of the first area AR1 may be increased.

FIGS. 10A and 10B illustrate the groove Gv, but according to another embodiment, the inorganic insulating layer IIL may not include (e.g., may exclude) the groove Gv. In this case, the second inorganic insulating layer 117 and the interlayer insulating layer 119 may be consecutively arranged in the first area AR1. According to another embodiment, the inorganic insulating layer IIL may include a hole exposing a top surface of the substrate 100 overlapping the first area AR1.

The connecting wire CWL may be connected (e.g., electrically connected) to the first outer pixel circuit OPC1. The connecting wire CWL may connect (e.g., electrically connect) the organic light-emitting diode OLED (i.e., the first display element). The connecting wire CWL may extend from the second area AR2 to the first area AR1. The connecting wire CWL may include a transparent conducting oxide.

Referring to FIG. 10A, the connecting wire CWL may be arranged between the inorganic insulating layer IIL and the first organic insulating layer OIL1. According to an embodiment, the connecting wire CWL may extend towards the groove Gv, on the interlayer insulating layer 119. The connecting wire CWL may be connected (e.g., electrically connected) to the first outer pixel circuit OPC1 through the connecting bridge wire BWL arranged between the first organic insulating layer OIL1 and the second organic insulating layer OIL2. According to an embodiment, the connecting bridge wire BWL may be connected (e.g., electrically connected) to the first outer pixel circuit OPC1 through a contact hole of the first organic insulating layer OIL1. The connecting bridge wire BWL may be connected (e.g., electrically connected) to the connecting wire CWL through another contact hole of the first organic insulating layer OIL1.

The connecting wire CWL may be connected (e.g., electrically connected) to the connecting electrode CM arranged between the first organic insulating layer OIL1 and the second organic insulating layer OIL2. The connecting electrode CM may be connected (e.g., electrically connected) to the connecting wire CWL through the contact hole of the first organic insulating layer OIL1.

According to an embodiment, at least one of the connecting bridge wire BWL or the connecting electrode CM may include a material having high conductivity. At least one of the connecting bridge wire BWL or the connecting electrode CM may include a conductive material including molybdenum (Mo), aluminum (Al), copper (Cu), or titanium (Ti), and may be formed in a multilayer or single layer structure including the conductive material. At least one of the connecting bridge wire BWL or the connecting electrode CM may have a multilayer structure of Ti/Al/Ti. According to an embodiment, the connecting bridge wire BWL and the connecting electrode CM may include a same material.

The second organic insulating layer OIL2 and the third organic insulating layer OIL3 may be disposed on the connecting bridge wire BWL and the connecting electrode CM. The connecting electrode CM may be connected (e.g., electrically connected) to the organic light-emitting diode OLED through a contact hole of the second organic insulating layer OIL2 and a contact hole of the third organic insulating layer OIL3. Accordingly, the organic light-emitting diode OLED may be connected (e.g., electrically connected) to the first outer pixel circuit OPC1 and driven by the first outer pixel circuit OPC1.

Referring to FIG. 10B, the connecting wire CWL may be arranged between the second organic insulating layer OIL2 and the third organic insulating layer OIL3. According to an embodiment, the connecting wire CWL may be connected (e.g., electrically connected) to the first outer pixel circuit OPC1 through the connecting bridge wire BWL arranged between the first organic insulating layer OIL1 and the second organic insulating layer OIL2. According to an embodiment, the connecting bridge wire BWL may be connected (e.g., electrically connected) to the first outer pixel circuit OPC1 through the contact hole of the first organic insulating layer OIL1. The connecting wire CWL may be connected (e.g., electrically connected) to the connecting bridge wire BWL through the contact hole of the second organic insulating layer OIL2.

The third organic insulating layer OIL3 may be disposed on the connecting wire CWL. The connecting wire CWL may be connected (e.g., electrically connected) to the organic light-emitting diode OLED through the contact hole of the third organic insulating layer OIL3. Accordingly, the organic light-emitting diode OLED may be connected (e.g., electrically connected) to the first outer pixel circuit OPC1 and driven by the first outer pixel circuit OPC1.

Figure 11A:
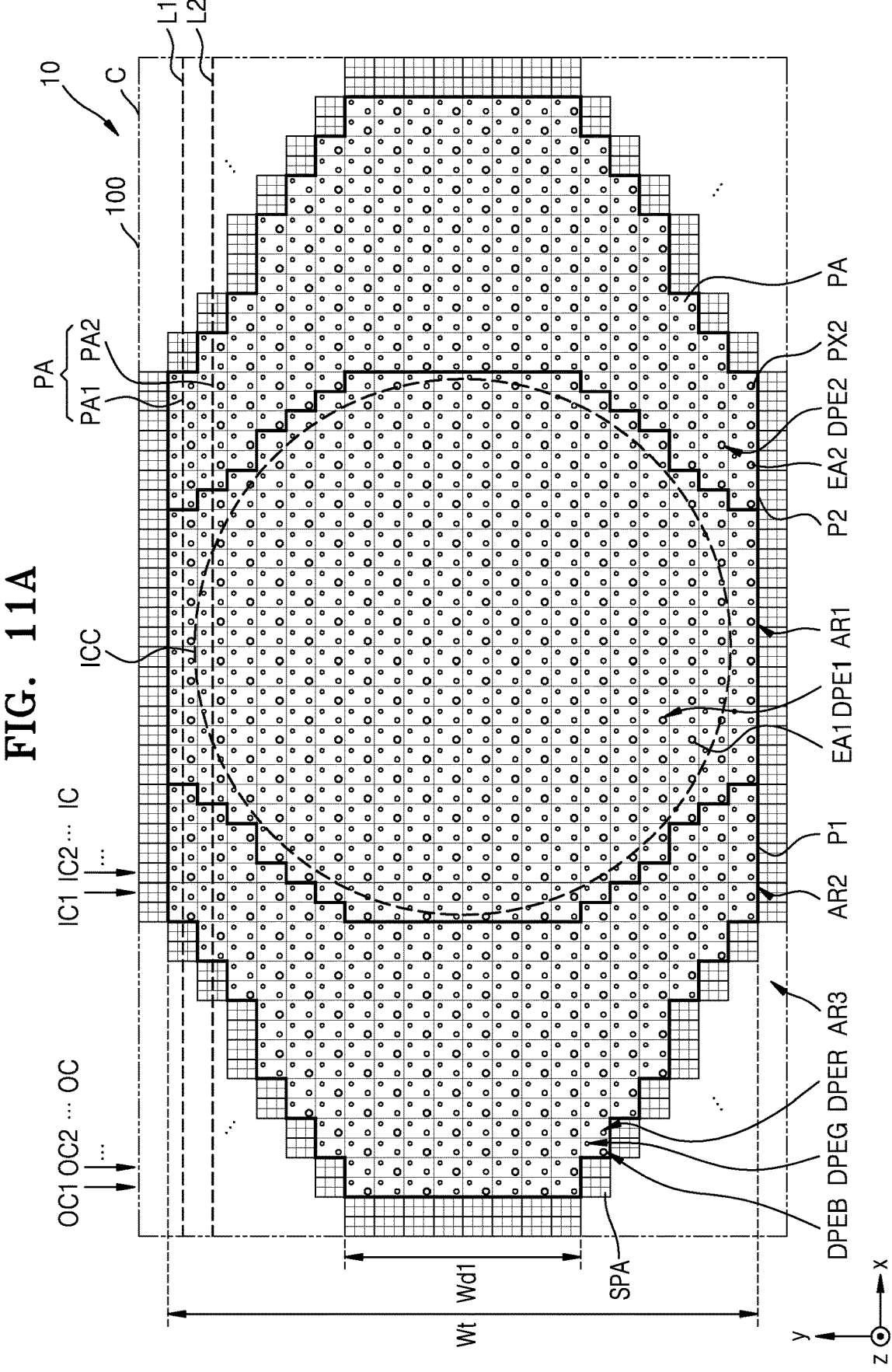
FIG. 11A is an enlarged view of the portion C of the display panel of FIG. 4, according to another embodiment.
Figure 11B:
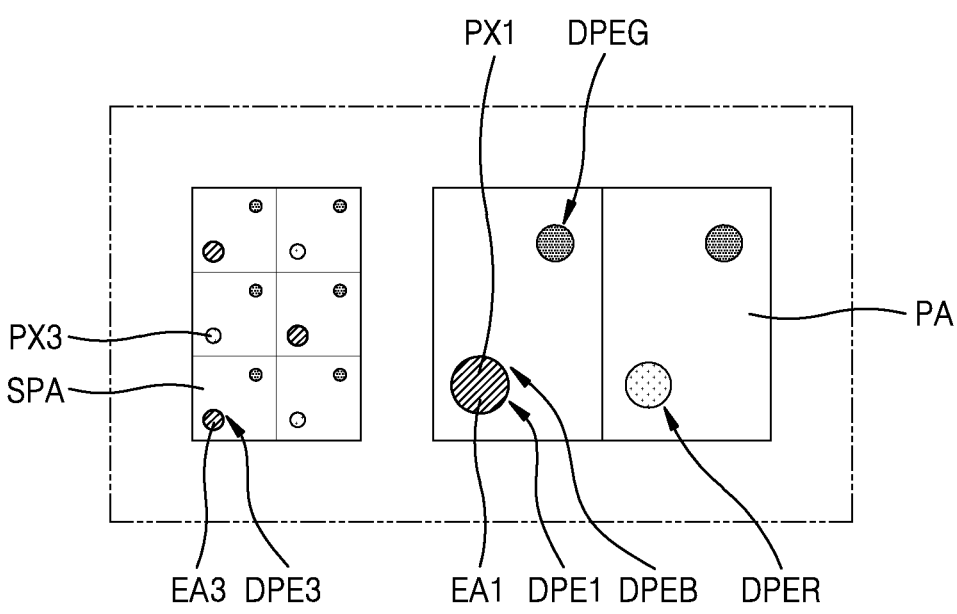
FIG. 11B is an enlarged view of a pixel area and a reduced pixel area of FIG. 11A.

FIG. 11A is an enlarged view of the portion C of the display panel 10 of FIG. 4, according to another embodiment. FIG. 11B is an enlarged view of the pixel area PA and the reduced pixel area SPA of FIG. 11A. In FIGS. 11A and 11B, like reference numerals as FIGS. 6A and 6B denote like elements, and thus redundant descriptions thereof may not be repeated.

Referring to FIGS. 11A and 11B, the display panel 10 may include the substrate 100, the first display element DPE1, the second display element DPE2, and the third display element DPE3. The substrate 100 may include the first area AR1, the second area AR2, and the third area AR3. The second area AR2 may be around (e.g., at least partially surround) the first area AR1.

The first area AR1 and the second area AR2 may include the plurality of the pixel areas PA. The plurality of pixel areas PA may be arranged in the first direction (e.g., the x or −x direction) and/or the second direction (e.g., the y or −y direction).

The numbers of plurality of pixel areas PA arranged in the first direction (e.g., the x or −x direction) may at least partially vary in the second direction (e.g., the y or −y direction). For example, the number of plurality of pixel areas PA arranged in the first direction (e.g., the x or −x direction) and crossing the center of the first area AR1 may be greater than the number of plurality of pixel areas PA arranged in the first direction (e.g., the x or −x direction) and crossing the edge of the first area AR1.

The numbers of plurality of pixel areas PA arranged in the second direction (e.g., the y or −y direction) may at least partially vary in the first direction (e.g., the x or −x direction). For example, the number of plurality of pixel areas PA arranged in the second direction (e.g., the y or −y direction) and crossing the center of the first area AR1 may be greater than the number of plurality of pixel areas PA arranged in the second direction (e.g., the y or −y direction) and crossing the edge of the second area AR2.

The plurality of pixel areas PA may include a plurality of first pixel areas PA1 and a plurality of second pixel areas PA2. The plurality of first pixel areas PA1 may overlap a first virtual extending line L1 extending in the first direction (e.g., the x or −x direction). In other words, the plurality of first pixel areas PA1 may be a plurality of pixel areas PA arranged in one row. The plurality of second pixel areas PA2 may overlap a second virtual extending line L2 extending in the first direction (e.g., the x or −x direction). In other words, the plurality of second pixel areas PA2 may be a plurality of pixel areas PA arranged in one row. The second virtual extending line L2 and the first virtual extending line L1 may be adjacent to each other. Accordingly, the plurality of first pixel areas PA1 and the plurality of second pixel areas PA2 may be adjacently arranged in the second direction (e.g., the y or −y direction).

A difference between the number of the plurality of first pixel areas PA1 and the number of the plurality of second pixel areas PA2 may be a multiple of four (4). Accordingly, the difference between the number of plurality of first pixel areas PA1 and the number of plurality of second pixel areas PA2 may be 4, 8, 12, 16, and/or the like. Accordingly, the sum of the width of the first area AR1 and the width of the second area AR2 in the first direction (e.g., the x or −x direction) may be rapidly decreased from the center of the first area AR1 to the edge of the first area AR1 in the second direction (e.g., the y or −y direction). In this case, even when the first area AR1 and second area AR2 have the resolution difference from the third area AR3, the first area AR1 and second area AR2 may not be easily recognized by the user and aesthetics may be improved.

Figure 12:
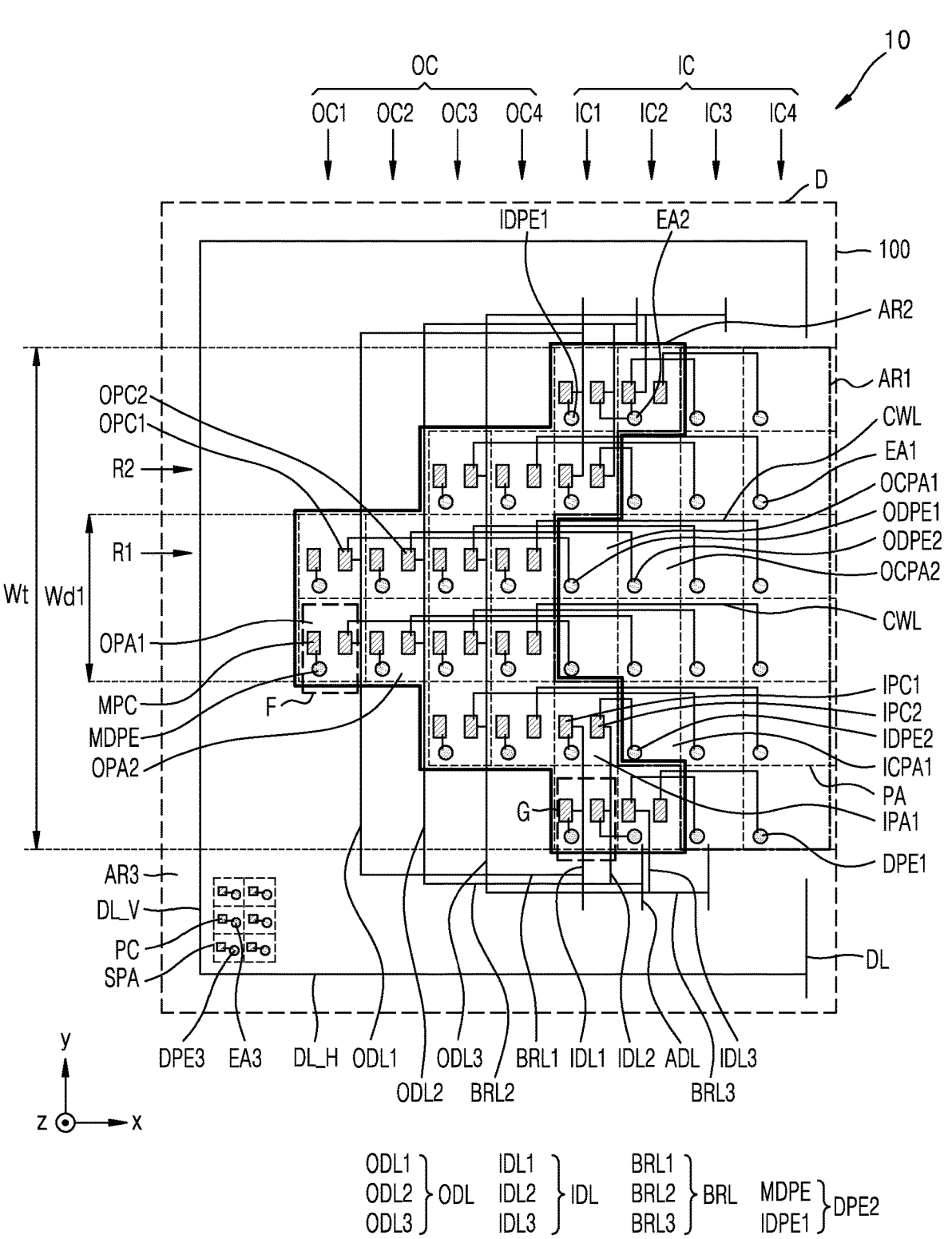
FIG. 12 is an enlarged view of the portion D of the display panel of FIG. 4, according to another embodiment.
Figure 13:
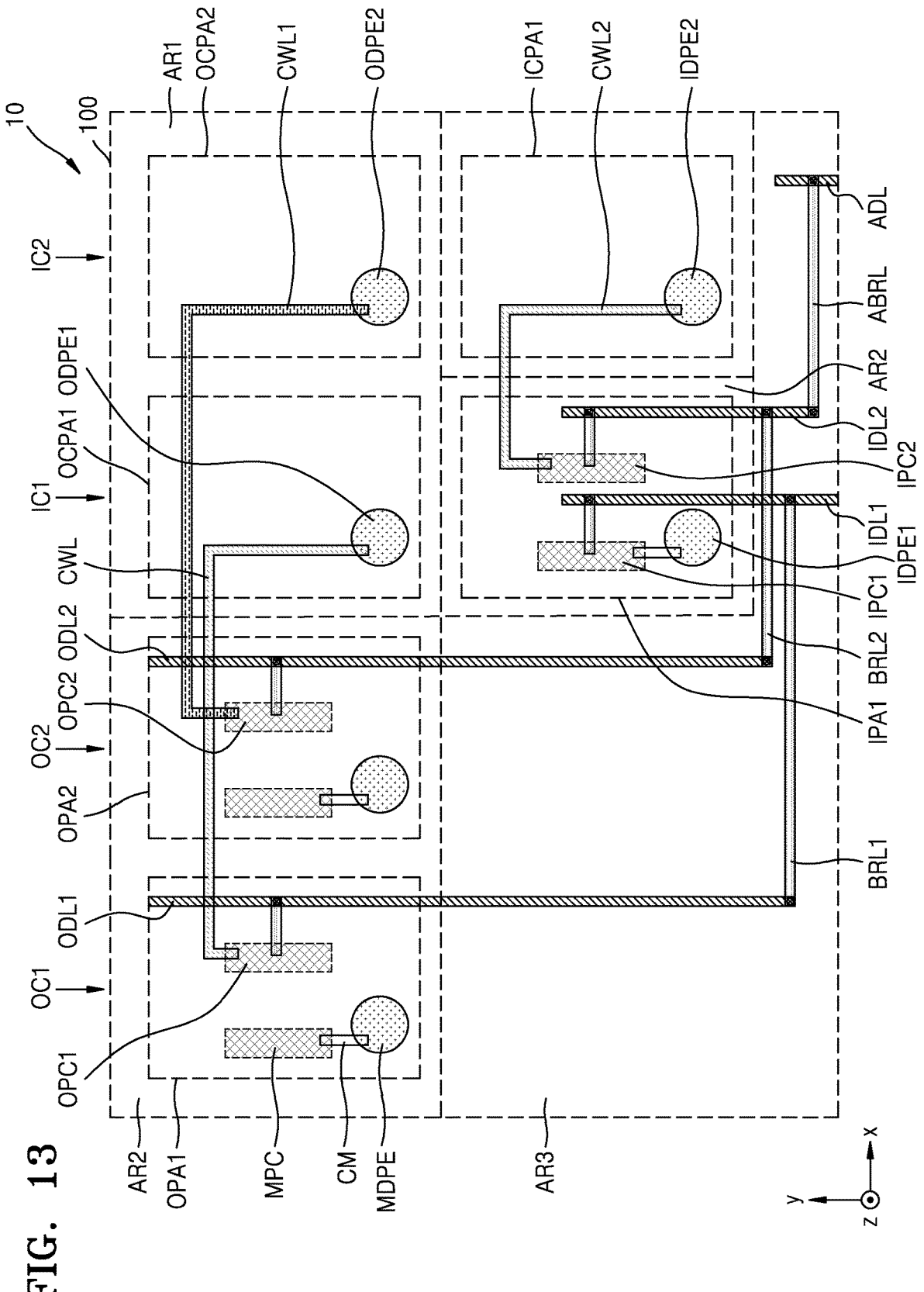
FIG. 13 is an enlarged view of a first outer pixel area, a second outer pixel area, a first outer corresponding pixel area, a second outer corresponding pixel area, a first inner pixel area, and a first inner corresponding pixel area of FIG. 12, according to an embodiment.

FIG. 12 is an enlarged view of the portion D of the display panel 10 of FIG. 4, according to another embodiment. FIG. 13 is an enlarged view of the first outer pixel area OPA1, a second outer pixel area OPA2, the first outer corresponding pixel area OCPA1, a second outer corresponding pixel area OCPA2, the first inner pixel area IPA1, and a first inner corresponding pixel area ICPA1 of FIG. 12, according to an embodiment. In FIGS. 12 and 13, like reference numerals as FIGS. 7 and 8 denote like elements, and thus redundant descriptions thereof may not be repeated.

Referring to FIGS. 12 and 13, the display panel 10 may include the substrate 100, the outer data line ODL, the inner data line IDL, an additional data line ADL, the bridge wire BRL, an additional bridge wire ABRL, the first outer pixel circuit OPC1, a second outer pixel circuit OPC2, the first inner pixel circuit IPC1, a second inner pixel circuit IPC2, an intermediate pixel circuit MPC, the connecting wire CWL, the first display element DPE1, the second display element DPE2, and the third display element DPE3. The substrate 100 may include the first area AR1, the second area AR2, and the third area AR3. The second area AR2 may be around (e.g., at least partially surround) the first area AR1.

The first area AR1 and the second area AR2 may include the plurality of the pixel areas PA. The plurality of pixel areas PA may be arranged in the first direction (e.g., the x or −x direction) and/or the second direction (e.g., they or −y direction).

The plurality of pixel areas PA may include the first outer pixel area OPA1 overlapping the first outer column OC1, the second outer pixel area OPA2 overlapping the second outer column OC2, the third outer pixel area overlapping the third outer column OC3, and the fourth outer pixel area overlapping the fourth outer column OC4. The plurality of pixel areas PA may include the first inner pixel area IPA1 overlapping the first inner column IC1, a second inner pixel area IPA2 overlapping the second inner column IC2, the third inner pixel area overlapping the third inner column IC3, and the fourth inner pixel area overlapping the fourth inner column IC4.

The third area AR3 may be around (e.g., at least partially surround) the second area AR2. The third area AR3 may include a plurality of the reduced pixel areas SPA. The plurality of reduced pixel areas SPA may be arranged in the first direction (e.g., the x or −x direction) and/or the second direction (e.g., the y or −y direction). According to an embodiment, the area of the reduced pixel area SPA may be smaller than the area of the pixel area PA.

The outer data line ODL may be configured to transmit a data signal and extend along the outer column OC. The outer data line ODL may extend in the second direction (e.g., the y or −y direction). The outer data line ODL may extend from the third area AR3 to the second area AR2. The outer data line ODL may overlap the second area AR2. According to an embodiment, the outer data line ODL may include the first outer data line ODL1, the second outer data line ODL2, and the third outer data line ODL3. The first outer data line ODL1 may extend along the first outer column OC1. The second outer data line ODL2 may extend along the second outer column OC2. The third outer data line ODL3 may extend along the third outer column OC3.

The inner data line IDL may extend along the inner column IC. The inner data line IDL may extend in the second direction (e.g., the y or –y direction). The inner data line IDL may extend from the third area AR3 to the second area AR2. According to an embodiment, the inner data line IDL may include the first inner data line IDL1, the second inner data line IDL2, and the third inner data line IDL3. The first inner data line IDL1 and the second inner data line IDL2 may extend along the first inner column IC1. The third inner data line IDL3 may extend along the second inner column IC2.

The inner data line IDL may be connected (e.g., electrically connected) to the outer data line ODL. The first inner data line IDL1 may be connected (e.g., electrically connected) to the first outer data line ODL1. Accordingly, the first inner data line IDL1 and the first outer data line ODL1 may be configured to transmit a same first data signal. The second inner data line IDL2 may be connected (e.g., electrically connected) to the second outer data line ODL2. Accordingly, the second inner data line IDL2 and the second outer data line ODL2 may be configured to transmit a same second data signal. The third inner data line IDL3 may be connected (e.g., electrically connected) to the third outer data line ODL3. Accordingly, the third inner data line IDL3 and the third outer data line ODL3 may be configured to transmit a same third data signal.

The outer data line ODL and the inner data line IDL may be connected (e.g., electrically connected) to the bridge wire BRL. The bridge wire BRL may extend in the first direction (e.g., the x or –x direction). The bridge wire BRL may be arranged on or at a layer different from the outer data line ODL and the inner data line IDL.

The bridge wire BRL may include the first bridge wire BRL1, the second bridge wire BRL2, and the third bridge wire BRL3. The first bridge wire BRL1 may connect (e.g., electrically connect) the first outer data line ODL1 and the first inner data line IDL1. The second bridge wire BRL2 may connect (e.g., electrically connect) the second outer data line ODL2 and the second inner data line IDL2. The third bridge wire BRL3 may connect (e.g., electrically connect) the third outer data line ODL3 and the third inner data line IDL3.

The first inner data line IDL1 may extend from the second area AR2 to the third area AR3. In one or more embodiments, the first inner data line IDL1 may overlap the first inner column IC1 and be connected (e.g., electrically connected) to the pixel circuit PC arranged in the third area AR3.

The additional data line ADL may extend in the second direction (e.g., the y or –y direction). According to an embodiment, the additional data line ADL may be connected (e.g., electrically connected) to the second inner data line IDL2. The additional data line ADL and the second inner data line IDL2 may be connected (e.g., electrically connected) to each other through the additional bridge wire ABRL. According to an embodiment, the additional data line ADL and the second inner data line IDL2 may be arranged on a different layer from the additional bridge wire ABRL. The additional data line ADL may overlap the second inner column IC2. Accordingly, the additional data line ADL may overlap the second inner column IC2 and be connected (e.g., electrically connected) to the pixel circuit PC arranged in the third area AR3.

The first outer pixel circuit OPC1 may be configured to drive the first display element DPE1 arranged in the first area AR1. The first outer pixel circuit OPC1 may be arranged in the first outer pixel area OPA1. The first outer pixel circuit OPC1 may be connected (e.g., electrically connected) to the first outer data line ODL1. The first outer pixel circuit OPC1 may be configured to receive the first data signal from the first outer data line ODL1.

The second outer pixel circuit OPC2 may be configured to drive the first display element DPE1 arranged in the first area AR1. The second outer pixel circuit OPC2 may be arranged in the second outer pixel area OPA2. The second outer pixel circuit OPC2 may be connected (e.g., electrically connected) to the second outer data line ODL2, like the first outer pixel circuit OPC1. The second outer pixel circuit OPC2 may be configured to receive the second data signal from the second outer data line ODL2.

The third outer pixel circuit may be configured to drive the first display element DPE1 arranged in the first area AR1. The third outer pixel circuit may be arranged in the third outer pixel area. The third outer pixel circuit may be connected (e.g., electrically connected) to the third outer data line ODL3, like the second outer pixel circuit OPC2. The third outer pixel circuit may be configured to receive the third data signal from the third outer data line ODL3.

The first inner pixel circuit IPC1 may be configured to drive the second display element DPE2 arranged in the second area AR2. The first inner pixel circuit IPC1 may be arranged in the first inner pixel area IPA1. The first inner pixel circuit IPC1 may be connected (e.g., electrically connected) to the first inner data line IDL1. The first inner pixel circuit IPC1 may be configured to receive the first data signal from the first inner data line IDL1. Accordingly, the first inner pixel circuit IPC1 overlapping the first inner column IC1 and the first outer pixel circuit OPC1 overlapping the first outer column OC1 may be configured to receive the same first data signal even when arranged in different columns.

According to an embodiment, the second inner pixel circuit IPC2 may be configured to drive the first display element DPE1 arranged in the first area AR1. According to another embodiment, the second inner pixel circuit IPC2 may be configured to drive the second display element DPE2 arranged in the second area AR2.

The second inner pixel circuit IPC2 may be arranged in the first inner pixel area IPA1. The second inner pixel circuit IPC2 may be connected (e.g., electrically connected) to the second inner data line IDL2. The second inner pixel circuit IPC2 may be configured to receive the second data signal from the second inner data line IDL2. Accordingly, the second inner pixel circuit IPC2 overlapping the first inner column IC1 and the second outer pixel circuit OPC2 overlapping the second outer column OC2 may be configured to receive the same second data signal even when arranged in different columns. Also, because the second inner data line IDL2 is connected (e.g., electrically connected) to the additional data line ADL, the second outer pixel circuit OPC2 overlapping the second outer column OC2, the second inner pixel circuit IPC2 overlapping the first inner column IC1, and the pixel circuit PC of the third area AR3 overlapping the second inner column IC2 may be configured to receive the same second data signal even when arranged in different columns.

According to an embodiment, the third inner pixel circuit may be configured to drive the first display element DPE1 arranged in the first area AR1. According to another embodiment, the third inner pixel circuit may be configured to drive the second display element DPE2 arranged in the second area AR2.

The third inner pixel circuit may be arranged in the second inner pixel area IPA2. The third inner pixel circuit may be connected (e.g., electrically connected) to the third inner data line IDL3. The third inner pixel circuit may be configured to receive the third data signal from the third inner data line IDL3. Accordingly, the third inner pixel circuit overlapping the second inner column IC2 and the third outer pixel circuit overlapping the third outer column OC3 may be configured to receive the same third data signal even when arranged in different columns.

The intermediate pixel circuit MPC may be configured to drive the second display element DPE2 arranged in the second area AR2. The intermediate pixel circuit MPC may be arranged in the second area AR2. According to an embodiment, the intermediate pixel circuit MPC may be arranged in the first outer pixel area OPA1 and the second outer pixel area OPA2.

According to an embodiment, the connecting wire CWL may extend from the second area AR2 to the first area AR1. According to another embodiment, the connecting wire CWL may extend from the second area AR2. The connecting wire CWL may extend in a direction from the outer column OC to the inner column IC. The plurality of connecting wires CWL may extend in a direction where the outer column OC and the inner column IC cross each other. The connecting wire CWL may include a transparent conducting oxide.

There may be the plurality of connecting wires CWL. The number of plurality of connecting wires CWL arranged in the first row R1 crossing the first outer column OC1 may be different from the number of plurality of connecting wires CWL arranged in the second row R2 different from the first row R1. When the second row R2 is closer to an edge (e.g., an outer edge) of the first area AR1 in the second direction (e.g., the y or −y direction) than the first row R1 is to the edge of the first area AR1, the number of plurality of connecting wires CWL arranged in the second row R2 may be less than the number of plurality of connecting wires CWL arranged in the first row R1. For example, the number of plurality of connecting wires CWL arranged in the second row R2 may be 3, and the number of plurality of connecting wires CWL arranged in the first row R1 may be 4.

There may be the plurality of connecting wires CWL. One of the plurality of connecting wires CWL may be the connecting wire CWL described with reference to FIG. 10A, and another one of the plurality of connecting wires CWL may be the connecting wire CWL described with reference to FIG. 10B. In this case, the one of the plurality of connecting wires CWL and the other one of the plurality of connecting wires CWL may overlap each other.

The connecting wire CWL may include a first connecting wire CWL1 and a second connecting wire CWL2. The first connecting wire CWL1 may extend from the second outer column OC2 to the second inner column IC2, and connect (e.g., electrically connect) the second outer pixel circuit OPC2 and a second outer display element ODPE2. The second connecting wire CWL2 may extend from the first inner column IC1 to the second inner column IC2, and connect (e.g., electrically connect) the second inner pixel circuit IPC2 and a second inner display element IDPE2. Here, the first inner column IC1 may be arranged between the second outer column OC2 and the second inner column IC2. Accordingly, a length of the first connecting wire CWL1 may be greater than a length of the second connecting wire CWL2. In other words, the first connecting wire CWL1 and the second connecting wire CWL2, which extend in different rows, may have different lengths.

The first display element DPE1 may be arranged in the first area AR1. According to an embodiment, there may be the plurality of first display elements DPE1, and the plurality of first display elements DPE1 may be arranged in the first area AR1. The first display element DPE1 may include the first emission area EA1. The first emission area EA1 may be an area in which the first display element DPE1 emits light.

The first display element DPE1 may include the first outer display element ODPE1 overlapping the first inner column IC1 and connected (e.g., electrically connected) to the first outer pixel circuit OPC1. The first outer display element ODPE1 may be arranged in the first outer corresponding pixel area OCPA1. The first outer display element ODPE1 may be connected (e.g., electrically connected) to the first outer pixel circuit OPC1 through the connecting wire CWL.

The first display element DPE1 may include the second outer display element ODPE2 overlapping the second inner column IC2 and connected (e.g., electrically connected) to the second outer pixel circuit OPC2. The second outer display element ODPE2 may be arranged in the second outer corresponding pixel area OCPA2. The second outer display element ODPE2 may be connected (e.g., electrically connected) to the second outer pixel circuit OPC2 through the connecting wire CWL.

One of the first display element DPE1 and the second display element DPE2 may include the second inner display element IDPE2 overlapping the second inner column IC2 and connected (e.g., electrically connected) to the second inner pixel circuit IPC2. The second inner display element IDPE2 may be arranged in the first inner corresponding pixel area ICPA1. The second inner display element IDPE2 may be connected (e.g., electrically connected) to the second inner pixel circuit IPC2 through the connecting wire CWL.

Accordingly, a pixel circuit may not be arranged in the first area AR1 and light or sound transmittance of the display panel 10 in the first area AR1 may be increased.

The second display element DPE2 may be arranged in the second area AR2. According to an embodiment, there may be the plurality of second display elements DPE2, and the plurality of second display elements DPE2 may be arranged in the second area AR2. The second display element DPE2 may include the second emission area EA2. The second emission area EA2 may be an area in which the second display element DPE2 emits light.

The second display element DPE2 may include the first inner display element IDPE1 overlapping the first inner pixel area IPA1 and connected (e.g., electrically connected) to the first inner pixel circuit IPC1. The first outer pixel circuit OPC1 and the first inner pixel circuit IPC1 may be configured to receive the same first data signal. According to an embodiment, the first outer pixel circuit OPC1 and the first inner pixel circuit IPC1 may be configured to receive different scan signals from each other and operate independently.

The second display element DPE2 may include the intermediate display element MDPE arranged in the second area AR2. There may be the plurality of intermediate display elements MDPE in the second area AR2. The intermediate display element MDPE may be connected (e.g., electrically connected) to the intermediate pixel circuit MPC. The intermediate display element MDPE may be connected (e.g., electrically connected) to the intermediate pixel circuit MPC through the connecting electrode CM.

According to an embodiment, the intermediate display element MDPE may be connected (e.g., electrically connected) to the intermediate pixel circuit MPC in the same pixel area PA. For example, the intermediate display element MDPE and the intermediate pixel circuit MPC may be arranged in the first outer pixel area OPA1 and connected (e.g., electrically connected) to each other.

The third display element DPE3 may be arranged in the third area AR3. The third display element DPE3 may be arranged in the reduced pixel area SPA. According to an embodiment, there may be the plurality of third display elements DPE3, and the plurality of third display elements DPE3 may be arranged in the third area AR3. The third display element DPE3 may include the third emission area EA3. The third emission area EA3 may be an area in which the third display element DPE3 emits light.

The third emission area EA3 may be smaller than one of the first emission area EA1 and the second emission area EA2. In this case, the number of third display elements DPE3 per unit area in the third area AR3 may be greater than the number of first display elements DPE1 per unit area in the first area AR1.

In one or more embodiments, the width Wd1 of the second area AR2 in the first outer column OC1 may be smaller than (e.g., less than) the sum Wt of the width of the first area AR1 and the width of the second area AR2 in the first inner column IC1. Accordingly, even when the first area AR1 and second area AR2 have the resolution difference from the third area AR3, the first area AR1 and second area AR2 may not be easily recognized by the user and aesthetics may be improved. Also, in one or more embodiments, the area of the second area AR2 may be additionally reduced by arranging the first inner pixel circuit IPC1 and the second inner pixel circuit IPC2 in the first inner pixel area IPA1.

Figure 14:
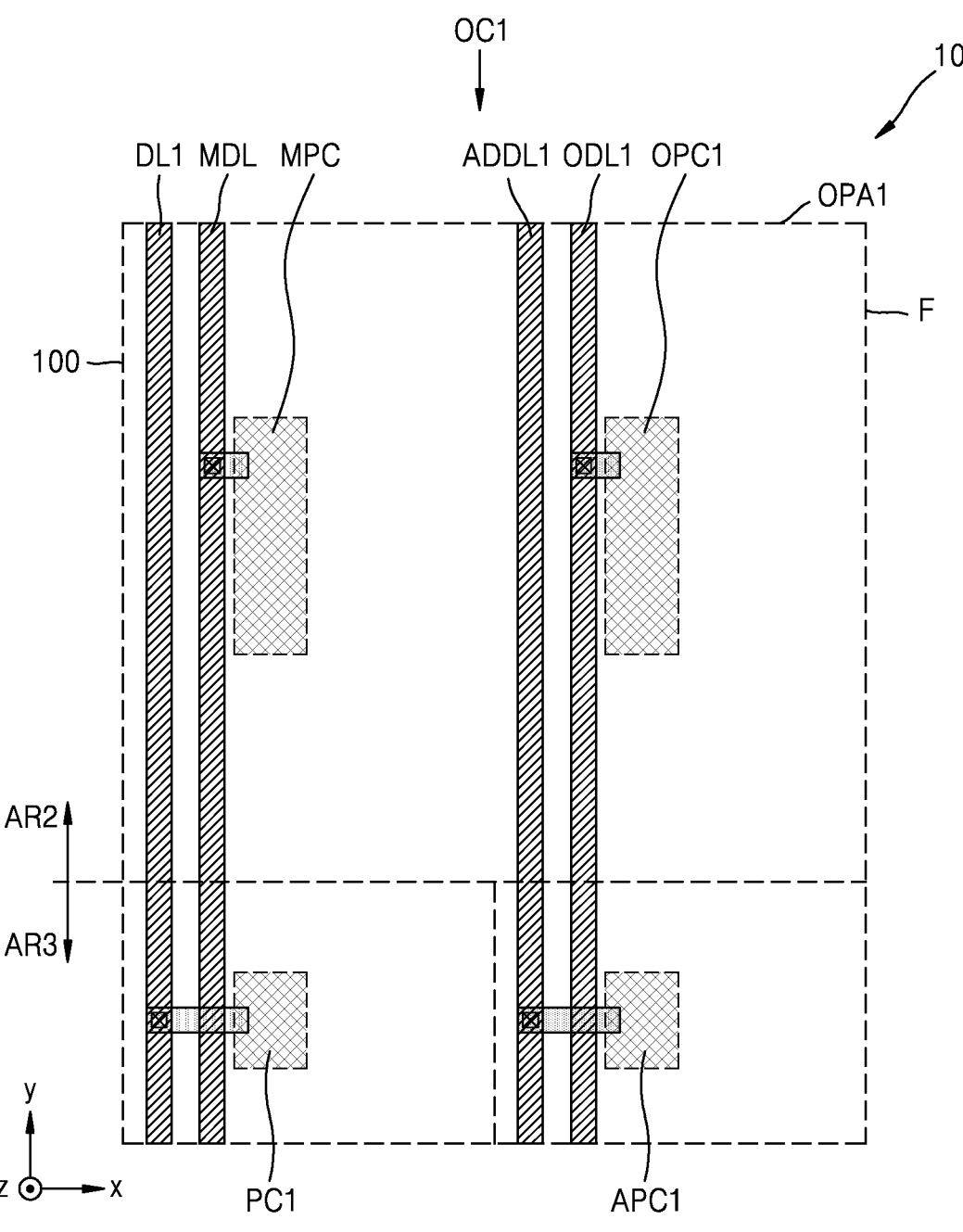
FIG. 14 is an enlarged view of a portion F of the display panel of FIG. 12, according to an embodiment.

FIG. 14 is an enlarged view of a portion F of the display panel 10 of FIG. 12, according to an embodiment.

Referring to FIG. 14, the display panel 10 may include the substrate 100, the first outer data line ODL1, an intermediate data line MDL, a first data line DL1, a first adjacent data line ADDL1, the first outer pixel circuit OPC1, the intermediate pixel circuit MPC, a first pixel circuit PC1, and a first adjacent pixel circuit APC1. The substrate 100 may include the second area AR2 and the third area AR3. The third area AR3 may be around (e.g., at least partially surround) the second area AR2.

The first outer data line ODL1 may be configured to transmit the data signal to the first outer pixel circuit OPC1. The first outer data line ODL1 may extend in the second direction (e.g., the y or −y direction). The first outer data line ODL1 may extend along the first outer column OC1. The first outer data line ODL1 may extend from the third area AR3 to the second area AR2.

The intermediate data line MDL may be configured to transmit the data signal to the intermediate pixel circuit MPC. The intermediate data line MDL may extend in the second direction (e.g., the y or −y direction). The intermediate data line MDL may extend along the first outer column OC1. The intermediate data line MDL may extend from the third area AR3 to the second area AR2.

The first data line DL1 may be configured to transmit the data signal to the first pixel circuit PC1. The first data line DL1 may extend in the second direction (e.g., the y or −y direction). The first data line DL1 may extend along the first outer column OC1. The first data line DL1 may be parallel to the intermediate data line MDL. The first data line DL1 may extend from the third area AR3 to the second area AR2.

The first adjacent data line ADDL1 may be configured to transmit the data signal to the first adjacent pixel circuit APC1. The first adjacent data line ADDL1 may extend in the second direction (e.g., the y or −y direction). The first adjacent data line ADDL1 may extend along the first outer column OC1. The first adjacent data line ADDL1 may be parallel to the first data line DL1. The first adjacent data line ADDL1 may extend from the third area AR3 to the second area AR2.

The first outer pixel circuit OPC1 and the intermediate pixel circuit MPC may each be arranged in the first outer pixel area OPA1. According to an embodiment, the first outer pixel circuit OPC1 and the intermediate pixel circuit MPC may be arranged in parallel to the first direction (e.g., the x or −x direction). According to an embodiment, the first outer pixel circuit OPC1 may be connected (e.g., electrically connected) to the first outer data line ODL1. The intermediate pixel circuit MPC may be connected (e.g., electrically connected) to the intermediate data line MDL.

The first pixel circuit PC1 and the first adjacent pixel circuit APC1 may be arranged adjacent to the first outer pixel area OPA1 in the third area AR3. The first pixel circuit PC1 and the first adjacent pixel circuit APC1 may be arranged in parallel to the first direction (e.g., the x or −x direction). According to an embodiment, the first pixel circuit PC1 may be connected (e.g., electrically connected) to the first data line DL1. The first adjacent pixel circuit APC1 may be connected (e.g., electrically connected) to the first adjacent data line ADDL1.

The first pixel circuit PC1 and the intermediate pixel circuit MPC may be configured to receive different data signals. According to another embodiment, the intermediate pixel circuit MPC and the first pixel circuit PC1 may be configured to receive a same data signal. In this case, the intermediate pixel circuit MPC and the first pixel circuit PC1 may be connected (e.g., electrically connected) to the intermediate data line MDL, and the first data line DL1 may not be provided.

Figure 15:
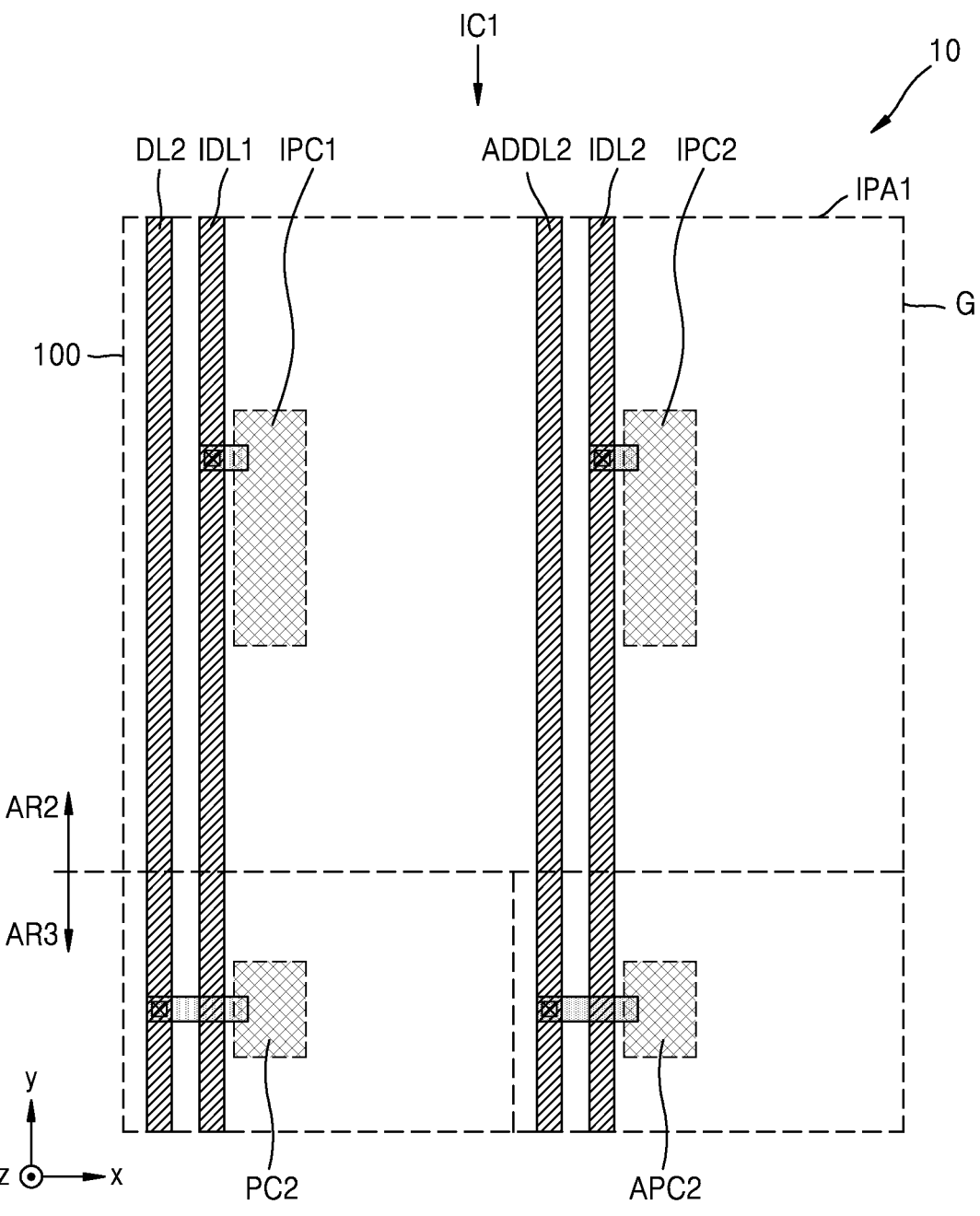
FIG. 15 is an enlarged view of a portion G of the display panel of FIG. 12, according to an embodiment.

FIG. 15 is an enlarged view of a portion G of the display panel 10 of FIG. 12, according to an embodiment.

Referring to FIG. 15, the display panel 10 may include the substrate 100, the first inner data line IDL1, the second inner data line IDL2, a second data line DL2, a second adjacent data line ADDL2, the first inner pixel circuit IPC1, the second inner pixel circuit IPC2, a second pixel circuit PC2, and a second adjacent pixel circuit APC2. The substrate 100 may include the second area AR2 and the third area AR3. The third area AR3 may be around (e.g., at least partially surround) the second area AR2.

The first inner data line IDL1 may be configured to transmit the data signal to the first inner pixel circuit IPC1. The first inner data line IDL1 may extend in the second direction (e.g., the y or −y direction). The first inner data line IDL1 may extend along the first inner column IC1. The first inner data line IDL1 may extend from the third area AR3 to the second area AR2.

The second inner data line IDL2 may be configured to transmit the data signal to the second inner pixel circuit IPC2. The second inner data line IDL2 may extend in the second direction (e.g., the y or −y direction). The second inner data line IDL2 may extend along the first inner column IC1. The second inner data line IDL2 may extend from the third area AR3 to the second area AR2.

The second data line DL2 may be configured to transmit the data signal to the second pixel circuit PC2. The second data line DL2 may extend in the second direction (e.g., the y or −y direction). The second data line DL2 may extend along the first inner column IC1. The second data line DL2 may be parallel to the first inner data line IDL1. The second data line DL2 may extend from the third area AR3 to the second area AR2.

The second adjacent data line ADDL2 may be configured to transmit the data signal to the second adjacent pixel circuit APC2. The second adjacent data line ADDL2 may extend in the second direction (e.g., the y or −y direction). The second adjacent data line ADDL2 may extend along the first inner column IC1. The second adjacent data line ADDL2 may be parallel to the second data line DL2. The second adjacent data line ADDL2 may extend from the third area AR3 to the second area AR2.

The first inner pixel circuit IPC1 and the second inner pixel circuit IPC2 may each be arranged in the first inner pixel area IPA1. According to an embodiment, the first inner pixel circuit IPC1 and the second inner pixel circuit IPC2 may be arranged in parallel to the first direction (e.g., the x or −x direction).

The second pixel circuit PC2 and the second adjacent pixel circuit APC2 may be arranged adjacent to the first inner pixel area IPA1 in the third area AR3. The second pixel circuit PC2 and the second adjacent pixel circuit APC2 may be arranged in parallel to the first direction (e.g., the x or −x direction). According to an embodiment, the second pixel circuit PC2 may be connected (e.g., electrically connected) to the second data line DL2. The second adjacent pixel circuit APC2 may be connected (e.g., electrically connected) to the second adjacent data line ADDL2.

The second pixel circuit PC2 and the first inner pixel circuit IPC1 may be configured to receive different data signals. According to another embodiment, the first inner pixel circuit IPC1 and the second pixel circuit PC2 may be configured to receive a same data signal. In this case, the second pixel circuit PC2 and the first inner pixel circuit IPC1 may be connected (e.g., electrically connected) to the first inner data line IDL1, and the second data line DL2 may not be provided.

Figure 16:
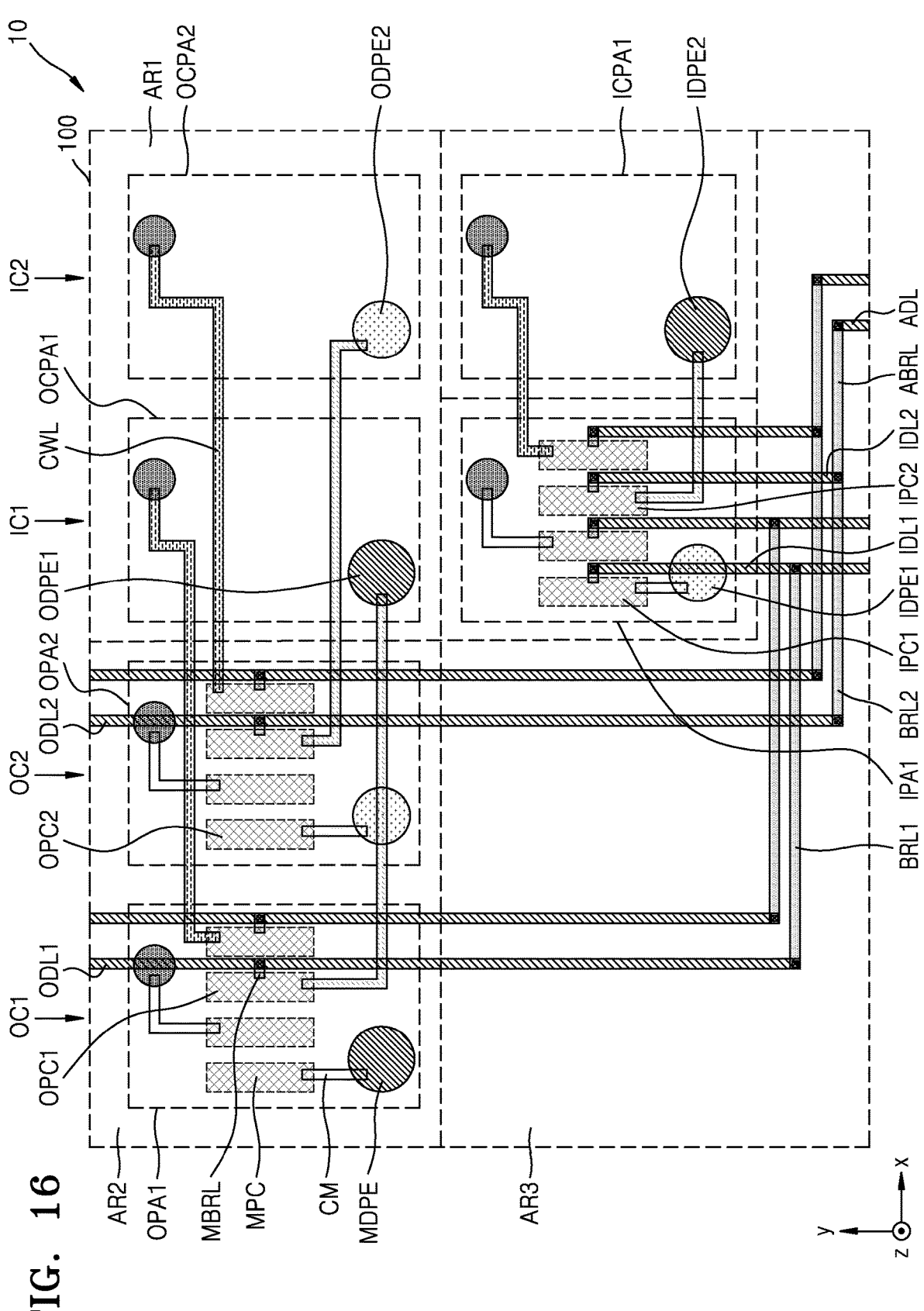
FIG. 16 is an enlarged view of the first outer pixel area, the second outer pixel area, the first outer corresponding pixel area, the second outer corresponding pixel area, the first inner pixel area, and the first inner corresponding pixel area of FIG. 12, according to another embodiment.

FIG. 16 is an enlarged view of the first outer pixel area OPA1, the second outer pixel area OPA2, the first outer corresponding pixel area OCPA1, the second outer corresponding pixel area OCPA2, the first inner pixel area IPA1, and the first inner corresponding pixel area ICPA1 of FIG. 12, according to another embodiment. In FIG. 16, like reference numerals as FIG. 13 denote like elements, and thus redundant descriptions thereof may not be repeated.

Referring to FIG. 16, the display panel 10 may include the substrate 100, the first outer data line ODL1, the second outer data line ODL2, the first inner data line IDL1, the second inner data line IDL2, the first outer pixel circuit OPC1, the second outer pixel circuit OPC2, the first inner pixel circuit IPC1, the second inner pixel circuit IPC2, the intermediate pixel circuit MPC, the connecting electrode CM, the connecting wire CWL, the first display element DPE1, and the second display element DPE2. The substrate 100 may include the first area AR1, the second area AR2, and the third area AR3. The second area AR2 may be around (e.g., at least partially surround) the first area AR1.

According to an embodiment, the first display element DPE1 may emit blue light, green light, or red light. According to another embodiment, the first display element DPE1 may emit blue light, green light, red light, or white light.

There may be the plurality of first display elements DPE1, and the plurality of first display elements DPE1 may be arranged in the first area AR1. The plurality of first display element DPE1 may be arranged in the Pentile Matrix™ structure or an RGBG matrix structure. According to an embodiment, the plurality of first display elements DPE1 may be arranged in the first outer corresponding pixel area OCPA1 and the second outer corresponding pixel area OCPA2. One of the plurality of first display elements DPE1 arranged in one pixel area may emit blue light or red light. Another one of the plurality of first display elements DPE1 arranged in the one pixel area may emit green light.

According to an embodiment, the second display element DPE2 may emit blue light, green light, or red light. According to another embodiment, the second display element DPE2 may emit blue light, green light, red light, or white light.

There may be the plurality of second display elements DPE2, and the plurality of second display elements DPE2 may be arranged in the second area AR2. The plurality of second display elements DPE2 may be arranged in the Pentile Matrix™ structure or an RGBG matrix structure. According to an embodiment, the plurality of second display elements DPE2 may be arranged in the first outer pixel area OPA1, the second outer pixel area OPA2, and the first inner pixel area IPA1. According to an embodiment, one of the plurality of second display elements DPE2 arranged in one pixel area may emit blue light or red light. Another one of the plurality of second display elements DPE2 arranged in the one pixel area may emit green light.

Accordingly, pluralities of the first outer data lines ODL1, the second outer data lines ODL2, the first inner data lines IDL1, and the second inner data lines IDL2 may be provided per column. Pluralities of the first outer pixel circuits OPC1, the second outer pixel circuits OPC2, the first inner pixel circuits IPC1, the second inner pixel circuits IPC2, the intermediate pixel circuits MPC, the connecting electrodes CM, and the connecting wires CWL may be provided per pixel area.

Figure 17:
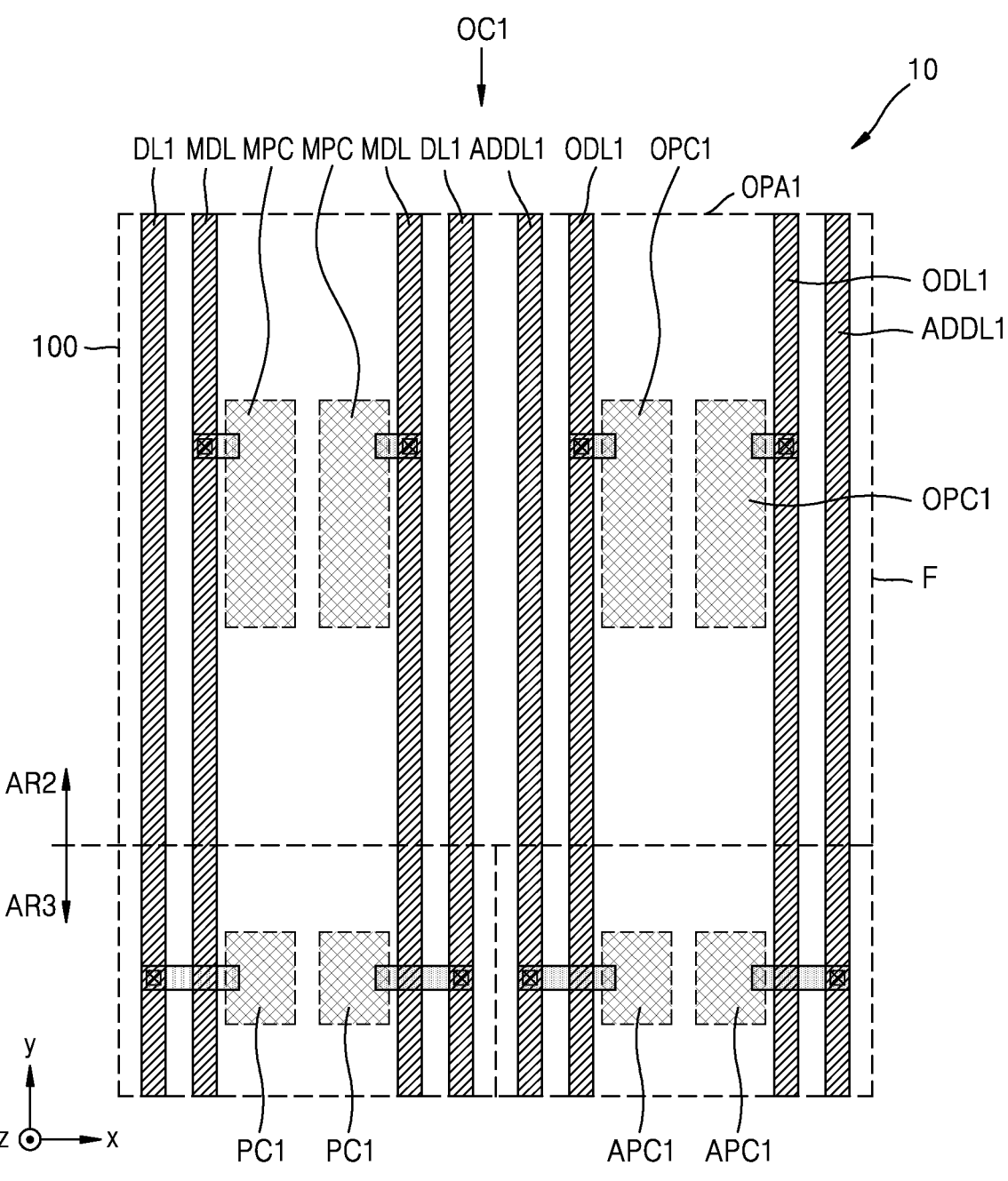
FIG. 17 is an enlarged view of the portion F of the display panel of FIG. 12, according to another embodiment.

FIG. 17 is an enlarged view of the portion F of the display panel 10 of FIG. 12, according to another embodiment. In FIG. 17, like reference numerals as FIG. 14 denote like elements, and thus redundant descriptions thereof may not be repeated.

Referring to FIG. 17, the display panel 10 may include the substrate 100, the first outer data line ODL1, the intermediate data line MDL, the first data line DL1, the first adjacent data line ADDL1, the first outer pixel circuit OPC1, the intermediate pixel circuit MPC, the first pixel circuit PC1, and the first adjacent pixel circuit APC1. The substrate 100 may include the second area AR2 and the third area AR3. The third area AR3 may be around (e.g., at least partially surround) the second area AR2.

Pluralities of the first outer pixel circuits OPC1, the intermediate pixel circuits MPC, the first pixel circuits PC1, and the first adjacent pixel circuits APC1 may be provided per pixel area. According to an embodiment, pluralities of the first outer data lines ODL1, the intermediate data lines MDL, the first data lines DL1, and the first adjacent data lines ADDL1 may be provided per column.

Figure 18:
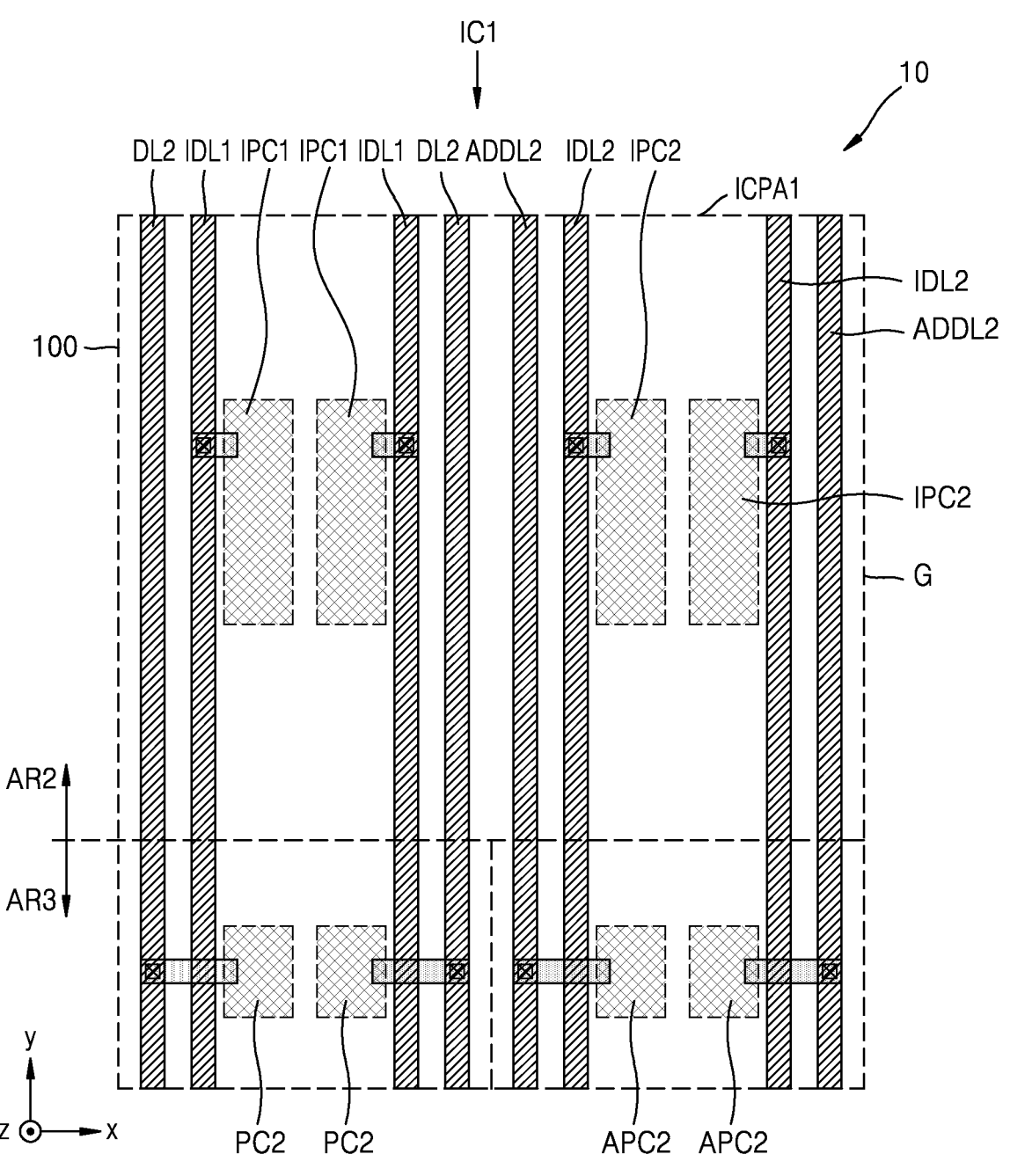
FIG. 18 is an enlarged view of the portion G of the display panel of FIG. 12, according to another embodiment.

FIG. 18 is an enlarged view of the portion G of the display panel 10 of FIG. 12, according to another embodiment.

Referring to FIG. 18, the display panel 10 may include the substrate 100, the first inner data line IDL1, the second inner data line IDL2, the second data line DL2, the second adjacent data line ADDL2, the first inner pixel circuit IPC1, the second inner pixel circuit IPC2, the second pixel circuit PC2, and the second adjacent pixel circuit APC2. The substrate 100 may include the second area AR2 and the third area AR3. The third area AR3 may be around (e.g., at least partially surround) the second area AR2.

Pluralities of the first inner pixel circuits IPC1, the second inner pixel circuits IPC2, the second pixel circuits PC2, and the second adjacent pixel circuits APC2 may be provided per pixel area. According to an embodiment, pluralities of the first inner data lines IDL1, the second inner data lines IDL2, the second data lines DL2, and the second adjacent data lines ADDL2 may be provided per column.

As described above, a display device according to an embodiment may include a first outer data line extending along a first outer column spaced from a first area, and a first inner data line extending along a first inner column at least partially overlapping the first area and connected (e.g., electrically connected) to the first outer data line. Accordingly, a first outer pixel circuit overlapping a first outer pixel area and a first inner pixel circuit overlapping a first inner pixel area may be configured to receive a same data signal, and a second area may have a shape at least partially surrounding an outer circumference of the first area.

In the display device according to an embodiment, a width of the second area at the first outer column may be smaller than (e.g., less than) a sum of a width of the first area and a width of the second area at the first inner column. Accordingly, even when the first area and second area have a resolution difference from a third area, the first area and second area may not be easily recognized by a user and aesthetics may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A display device comprising:
a substrate including a first area, a second area surrounding at least a portion of the first area, and a third area surrounding the second area, the second area including a first outer pixel area overlapping a first outer column spaced from the first area and a first inner pixel area overlapping a first inner column at least partially overlapping the first area;
a first outer data line extending along the first outer column;
a first inner data line electrically connected to the first outer data line and extending along the first inner column;
a first outer pixel circuit arranged in the first outer pixel area and electrically connected to the first outer data line;
a first inner pixel circuit arranged in the first inner pixel area and electrically connected to the first inner data line;
a first display element arranged in the first area and comprising a first outer display element overlapping the first inner column and electrically connected to the first outer pixel circuit;
a second display element arranged in the second area and comprising a first inner display element overlapping the first inner pixel area and electrically connected to the first inner pixel circuit;
a second data line extending along the first inner column in parallel with the first inner data line; and a second pixel circuit arranged adjacent to the first inner pixel area in the third area, and electrically connected to the second data line.

2. The display device of claim 1, further comprising a plurality of connecting wires extending from the second area to the first area and comprising a transparent conducting oxide,
wherein a number of the plurality of connecting wires arranged on a first row crossing the first outer column is different from a number of the plurality of connecting wires arranged on a second row different from the first row.

3. The display device of claim 1, further comprising an intermediate pixel circuit arranged in the first outer pixel area,
wherein the second display element further comprises an intermediate display element arranged in the first outer pixel area and electrically connected to the intermediate pixel circuit.

4. The display device of claim 3, further comprising:
an intermediate data line extending along the first outer column and electrically connected to the intermediate pixel circuit;
a first data line extending along the first outer column in parallel with the intermediate data line; and
a first pixel circuit arranged adjacent to the first outer pixel area in the third area, and electrically connected to the first data line.

5. The display device of claim 1, wherein the second area further comprises a second outer pixel area overlapping a second outer column different from the first outer column and spaced from the first area,
wherein the display device further comprises:
a second outer data line extending along the second outer column;
a second inner data line electrically connected to the second outer data line and extending along the first inner column;
a second outer pixel circuit arranged in the second outer pixel area and electrically connected to the second outer data line; and
a second inner pixel circuit arranged in the first inner pixel area and electrically connected to the second inner data line,
wherein the first display element further comprises a second outer display element overlapping a second inner column different from the first inner column,
wherein any one of the first display element or the second display element comprises a second inner display element at least partially overlapping the first area and overlapping the second inner column different from the first inner column,
wherein the second outer display element is electrically connected to the second outer pixel circuit, and
wherein the second inner display element is electrically connected to the second inner pixel circuit.

6. The display device of claim 5, further comprising:
a first connecting wire extending from the second outer column to the second inner column, and electrically connecting the second outer pixel circuit and the second outer display element to each other; and
a second connecting wire extending from the first inner column to the second inner column, and electrically connecting the second inner pixel circuit and the second inner display element to each other,
wherein the first inner column is arranged between the second outer column and the second inner column.

7. The display device of claim 5, further comprising an additional data line electrically connected to the second inner data line and extending along the second inner column.

8. The display device of claim 1, further comprising a third display element arranged in the third area and including an emission area smaller than any one of an emission area of the first display element or an emission area of the second display element, wherein a width of the second area at the first outer column is less than a sum of a width of the first area and a width of the second area at the first inner column.

9. The display device of claim 8, wherein the first area and the second area further comprise a plurality of pixel areas arranged in a first direction and a second direction perpendicular to the first direction, wherein the plurality of pixel areas comprise:

a plurality of first pixel areas overlapping a first virtual extending line extending in the first direction; and a plurality of second pixel areas overlapping a second virtual extending line extending in the first direction and adjacent to the first virtual extending line, and wherein a difference between a number of the plurality of first pixel areas and a number of the plurality of second pixel areas is a multiple of four.

10. A display device comprising:

a substrate including a first area, a second area at least partially surrounding the first area and comprising a first outer pixel area and a first inner pixel area, and a third area at least partially surrounding the second area;

a first display element arranged in the first area;

a second display element arranged in the second area;

a third display element arranged in the third area and including an emission area smaller than any one of an emission area of the first display element or an emission area of the second display element;

a first outer data line extending along a first outer column spaced from the first area and overlapping the first outer pixel area;

a first inner data line electrically connected to the first outer data line and extending along a first inner column at least partially overlapping the first area and overlapping the first inner pixel area;

a first outer pixel circuit arranged in the first outer pixel area and electrically connected to the first outer data line;

a first inner pixel circuit arranged in the first inner pixel area and electrically connected to the first inner data line;

a second data line extending along the first inner column in parallel with the first inner data line; and a second pixel circuit arranged adjacent to the first inner pixel area in the third area, and electrically connected to the second data line, wherein a width of the second area at the first outer column is less than a sum of a width of the first area and a width of the second area at the first inner column, wherein the first display element comprises a first outer display element overlapping the first inner column and electrically connected to the first outer pixel circuit, and wherein the second display element comprises a first inner display element arranged in the first inner pixel area and electrically connected to the first inner pixel circuit.

11. The display device of claim 10, wherein the first area and the second area comprise a plurality of pixel areas arranged in a first direction and a second direction perpendicular to the first direction, wherein the plurality of pixel areas comprise:

a plurality of first pixel areas overlapping a first virtual extending line extending in the first direction; and a plurality of second pixel areas overlapping a second virtual extending line extending in the first direction and adjacent to the first virtual extending line, and wherein a difference between a number of the plurality of first pixel areas and a number of the plurality of second pixel areas is a multiple of four.

12. The display device of claim 10, further comprising a plurality of connecting wires extending from the second area to the first area and comprising a transparent conducting oxide, wherein a number of the plurality of connecting wires arranged on a first row crossing the first outer column is different from a number of the plurality of connecting wires arranged on a second row different from the first row.

13. The display device of claim 10, wherein the second area further comprises a second outer pixel area overlapping a second outer column different from the first outer column and spaced from the first area, wherein the display device further comprises:

a second outer data line extending along the second outer column;

a second inner data line electrically connected to the second outer data line and extending along the first inner column;

a second outer pixel circuit arranged in the second outer pixel area and electrically connected to the second outer data line; and a second inner pixel circuit arranged in the first inner pixel area and electrically connected to the second inner data line, wherein the first display element further comprises a second outer display element overlapping a second inner column different from the first inner column, wherein any one of the first display element or the second display element comprises a second inner display element at least partially overlapping the first area and overlapping the second inner column different from the first inner column, wherein the second outer display element is electrically connected to the second outer pixel circuit, and wherein the second inner display element is electrically connected to the second inner pixel circuit.

14. The display device of claim 13, further comprising:

a first connecting wire extending from the second outer column to the second inner column, and electrically connecting the second outer pixel circuit and the second outer display element to each other; and a second connecting wire extending from the first inner column to the second inner column, and electrically connecting the second inner pixel circuit and the second inner display element to each other, wherein the first inner column is arranged between the second outer column and the second inner column.

15. The display device of claim 13, further comprising an additional data line electrically connected to the second inner data line and extending along the second inner column.

16. The display device of claim 10, further comprising an intermediate pixel circuit overlapping the first outer pixel area, wherein the second display element further comprises an intermediate display element arranged in the first outer pixel area and electrically connected to the intermediate pixel circuit.

17. The display device of claim 16, further comprising:

an intermediate data line extending along the first outer column and electrically connected to the intermediate pixel circuit;

a first data line extending along the first outer column in parallel with the intermediate data line; and a first pixel circuit arranged adjacent to the first outer pixel area in the third area, and electrically connected to the first data line.

* * * * *